US012565509B2

(12) United States Patent
Joo et al.

(10) Patent No.: US 12,565,509 B2
(45) **Date of Patent: *Mar. 3, 2026**

(54) POLYCYCLIC AROMATIC DERIVATIVE COMPOUND AND ORGANIC LIGHT-EMITTING DEVICE USING SAME

(71) Applicant: SFC CO., LTD, Cheongju-si (KR)

(72) Inventors: Sung-hoon Joo, Cheongju-si (KR); Bong-ki Shin, Cheongju-si (KR); Byung-sun Yang, Cheongju-si (KR); Ji-hwan Kim, Cheongju-si (KR); Hyeon-jun Jo, Cheongju-si (KR); Sung-eun Choi, Cheongju-si (KR)

(73) Assignee: SFC CO., LTD, Cheongju-si (KR)

( * ) Notice: Subject to any disclaimer, the term of this patent is extended or adjusted under 35 U.S.C. 154(b) by 894 days.

This patent is subject to a terminal disclaimer.

(21) Appl. No.: 17/794,838

(22) PCT Filed: Jan. 21, 2021

(86) PCT No.: PCT/KR2021/000817

§ 371 (c)(1),
(2) Date: Jul. 22, 2022

(87) PCT Pub. No.: WO2021/150026

PCT Pub. Date: Jul. 29, 2021

(65) Prior Publication Data

US 2023/0125146 A1 Apr. 27, 2023

(30) Foreign Application Priority Data

Jan. 22, 2020 (KR) ........................ 10-2020-0008414

(51) Int. Cl.
*C07F 5/02* (2006.01)
*H10K 85/60* (2023.01)
*H10K 50/11* (2023.01)

(52) U.S. Cl.
CPC ........... *C07F 5/027* (2013.01); *H10K 85/626* (2023.02); *H10K 85/658* (2023.02); *H10K 50/11* (2023.02)

(58) Field of Classification Search
CPC .......................... H10K 85/615; H10K 85/658
See application file for complete search history.

(56) References Cited

U.S. PATENT DOCUMENTS

| | | | | |
|---|---|---|---|---|
| 11,895,907 B2 * | 2/2024 | Sim | C07F 5/027 |
| 11,985,891 B2 * | 5/2024 | Joo | C07B 59/004 |
| 2007/0106103 A1 * | 5/2007 | Ikeda | H05B 33/14 428/917 |
| 2019/0115538 A1 * | 4/2019 | Lim | H10K 85/626 |
| 2020/0172558 A1 | 6/2020 | Joo et al. | |
| 2020/0395553 A1 | 12/2020 | Park et al. | |
| 2020/0411771 A1 * | 12/2020 | Kim | H10K 85/615 |
| 2021/0202850 A1 * | 7/2021 | Wang | C07F 9/6596 |

FOREIGN PATENT DOCUMENTS

| | | | |
|---|---|---|---|
| CN | 107417715 | A | 12/2017 |
| JP | 2020-83896 | A | 6/2020 |
| JP | 2020-202377 | A | 12/2020 |
| JP | 7038422 | B2 | 3/2022 |
| JP | 7094035 | B2 | 7/2022 |
| KR | 10-2017-0127593 | A | 11/2017 |
| KR | 10-2018-0082124 | A | 7/2018 |
| KR | 10-2018-0108559 | A | 10/2018 |
| KR | 10-2019-0078541 | A | 7/2019 |
| KR | 10-2019-0140421 | A | 12/2019 |
| KR | 10-2053569 | B1 | 12/2019 |
| KR | 10-2020-0004266 | A | 1/2020 |
| KR | 10-2094830 | B1 | 3/2020 |
| WO | WO 2018/168991 | A1 | 9/2018 |
| WO | WO 2019/164331 | A1 | 8/2019 |
| WO | WO 2021/107678 | A1 | 6/2021 |

OTHER PUBLICATIONS

Japanese Office Action issued on Aug. 8, 2023, in counterpart Japanese Patent Application No. 2022-544344 (3 pages in Japanese).
International Search Report issued on May 6, 2021, in counterpart PCT Patent Application No. PCT/KR2021/000817 (3 pages in Korean).

* cited by examiner

*Primary Examiner* — Michael M Dollinger
(74) *Attorney, Agent, or Firm* — NSIP Law

(57) ABSTRACT

The present invention relates to a polycyclic aromatic derivative compound and an organic light-emitting device having high efficiency and long lifespan, the device applying the compound in various organic layers so as to remarkably improve luminous efficiency. According to the invention, an organic light-emitting device having high efficiency and long lifespan and having remarkably improved luminous efficiency can be implemented, and thus can be industrially useful in various display devices and lighting devices.

10 Claims, No Drawings

POLYCYCLIC AROMATIC DERIVATIVE COMPOUND AND ORGANIC LIGHT-EMITTING DEVICE USING SAME

CROSS REFERENCE TO RELATED APPLICATIONS

This application is a U.S. National Stage Application of International Application No. PCT/KR2021/000817, filed on Jan. 21, 2021, which claims the benefit under 35 USC 119(a) and 365(b) of Korean Patent Application No. 10-2020-0008414 filed on Jan. 22, 2020, in the Korean Intellectual Property Office, the entire disclosure of which is incorporated herein by reference for all purposes.

TECHNICAL FIELD

The present invention relates to a polycyclic aromatic derivative and a highly efficient and long-lasting organic electroluminescent device with significantly improved luminous efficiency using the polycyclic aromatic derivative.

BACKGROUND ART

Organic electroluminescent devices are self-luminous devices in which electrons injected from an electron injecting electrode (cathode) recombine with holes injected from a hole injecting electrode (anode) in a light emitting layer to form excitons, which emit light while releasing energy. Such organic electroluminescent devices have the advantages of low driving voltage, high luminance, large viewing angle, and short response time and can be applied to full-color light emitting flat panel displays. Due to these advantages, organic electroluminescent devices have received attention as next-generation light sources.

The above characteristics of organic electroluminescent devices are achieved by structural optimization of organic layers of the devices and are supported by stable and efficient materials for the organic layers such as hole injecting materials, hole transport materials, light emitting materials, electron transport materials, electron injecting materials, and electron blocking materials. However, more research still needs to be done to develop structurally optimized organic layers for organic electroluminescent devices and stable and efficient materials for organic layers of organic electroluminescent devices.

As such, there is a continued need to develop structures of organic electroluminescent devices optimized to improve their luminescent properties and new materials capable of supporting the optimized structures of organic electroluminescent devices.

DISCLOSURE

Technical Problem

Accordingly, the present invention intends to provide an organic electroluminescent compound that is employed in an organic layer of an organic electroluminescent device to achieve high efficiency and long lifetime of the device. The present invention also intends to provide an organic electroluminescent device including the organic electroluminescent compound.

Technical Solution

One aspect of the present invention provides an organic electroluminescent compound represented by Formula A-1 or A-2:

[Formula A-1]

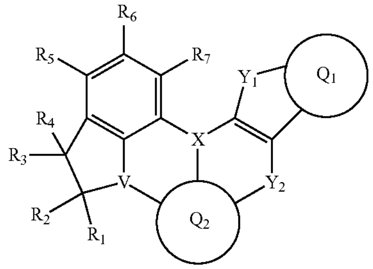

[Formula A-2]

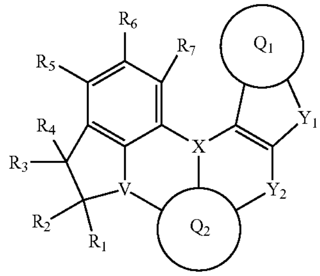

More specific structures of Formulae A-1 and A-2, definitions of $Q_1$ and $Q_2$, X, $Y_1$, $Y_2$, V, and $R_1$ to $R_7$ in Formulae A-1 and A-2, and specific polycyclic compounds that can be represented by Formulae A-1 and A-2 are described below.

A further aspect of the present invention provides an organic electroluminescent device including a first electrode, a second electrode opposite to the first electrode, and one or more organic layers interposed between the first and second electrodes wherein one of the organic layers includes at least one of the polycyclic compounds represented by Formulae A-1 and A-2.

Advantageous Effects

The polycyclic aromatic derivative of the present invention can be employed in an organic layer of an organic electroluminescent device to achieve high efficiency and long lifetime of the device.

BEST MODE

The present invention will now be described in more detail.

The present invention is directed to a polycyclic aromatic derivative for use in an organic electroluminescent device, represented by Formula A-1 or A-2:

[Formula A-1]

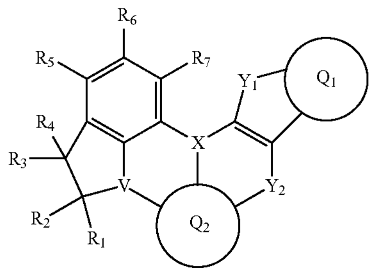

-continued

[Formula A-2]

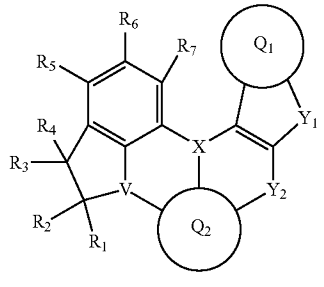

wherein $Q_1$ and $Q_2$ are identical to or different from each other and are each independently a substituted or unsubstituted $C_6$-$C_{50}$ aromatic hydrocarbon ring, a substituted or unsubstituted $C_2$-$C_{50}$ aromatic heterocyclic ring or a substituted or unsubstituted $C_3$-$C_{30}$ mixed aliphatic-aromatic ring, X is selected from B, P, P=O, and P=S, $Y_1$ and $Y_2$ are identical to or different from each other and are each independently selected from N—$R_8$, $CR_9R_{10}$, O, S, Se, and $SiR_{11}R_{12}$, V is selected from N and P, and $R_1$ to $R_{12}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_2$ and $R_3$ are optionally linked to each other to form a monocyclic or polycyclic ring, $R_7$ is optionally bonded to the adjacent ring $Q_1$ to form an alicyclic or aromatic monocyclic or polycyclic ring, each of $R_8$ to $R_{12}$ is optionally bonded to one or more of the rings $Q_1$ and $Q_2$ to form an alicyclic or aromatic monocyclic or polycyclic ring, $R_5$ and $R_6$ are optionally linked to each other to form an alicyclic or aromatic monocyclic or polycyclic ring, $R_9$ and $R_{10}$ are optionally linked to each other to form an alicyclic or aromatic monocyclic or polycyclic ring, and $R_{11}$ and $R_{12}$ are optionally linked to each other to form an alicyclic or aromatic monocyclic or polycyclic ring.

According to a preferred embodiment of the present invention, $Q_1$ and $Q_2$ are each independently a substituted or unsubstituted $C_2$-$C_{50}$ aromatic heterocyclic ring.

According to one embodiment of the present invention, X in Formula A-1 or A-2 may be boron (B). The presence of boron (B) in the structure of the polycyclic aromatic derivative ensures high efficiency and long lifetime of the organic electroluminescent device.

The use of the polycyclic aromatic derivative makes the organic electroluminescent device highly efficient and long lasting.

According to one embodiment of the present invention, the polycyclic aromatic derivative of Formula A-1 may be represented by Formula A-3:

[Formula A-3]

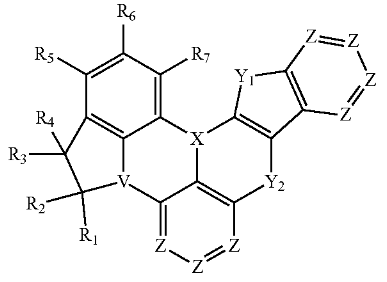

wherein the moieties Z are identical to or different from each other and are each independently CR or N, the groups R are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other or are each independently optionally linked to an adjacent substituent to form an alicyclic or aromatic monocyclic or polycyclic ring and one or more of the carbon atoms in the alicyclic or aromatic monocyclic or polycyclic ring are optionally replaced with heteroatoms selected from N, S, and O, and X, $Y_1$, $Y_2$, V, and $R_1$ to $R_7$ are as defined in Formulae A-1 and A-2, and the polycyclic aromatic derivative of Formula A-2 may be represented by Formula A-4:

[Formula A-4]

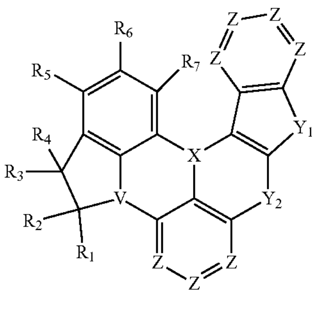

wherein Z and R are as defined in Formula A-3 and X, $Y_1$, $Y_2$, V, and $R_1$ to $R_7$ are as defined in Formulae A-1 and A-2.

As used herein, the term "substituted" in the definition of $Q_1$ and $Q_2$, R, and $R_1$ to $R_{12}$ indicates substitution with one or more substituents selected from deuterium, cyano, halogen, hydroxyl, nitro, $C_1$-$C_{24}$ alkyl, $C_3$-$C_{24}$ cycloalkyl, $C_1$-$C_{24}$ haloalkyl, $C_1$-$C_{24}$ alkenyl, $C_1$-$C_{24}$ alkynyl, $C_1$-$C_{24}$ heteroalkyl, $C_1$-$C_{24}$ heterocycloalkyl, $C_6$-$C_{24}$ aryl, $C_6$-$C_{24}$ arylalkyl, $C_2$-$C_{24}$ heteroaryl, $C_2$-$C_{24}$ heteroarylalkyl, $C_1$-$C_{24}$ alkoxy, $C_1$-$C_{24}$ alkylamino, $C_1$-$C_{24}$ arylamino, $C_1$-$C_{24}$ heteroarylamino, $C_1$-$C_{24}$ alkylsilyl, $C_1$-$C_{24}$ arylsilyl, and $C_1$-$C_{24}$ aryloxy, or a combination thereof. As used herein, the term "unsubstituted" indicates having no substituent.

In the "substituted or unsubstituted $C_1$-$C_{10}$ alkyl", "substituted or unsubstituted $C_6$-$C_{30}$ aryl", etc., the number of carbon atoms in the alkyl or aryl group indicates the number of carbon atoms constituting the unsubstituted alkyl or aryl moiety without considering the number of carbon atoms in the substituent(s). For example, a phenyl group substituted with a butyl group at the para-position corresponds to a $C_6$ aryl group substituted with a $C_4$ butyl group.

As used herein, the expression "form a ring with an adjacent substituent" means that the corresponding substituent combines with an adjacent substituent to form a substituted or unsubstituted alicyclic or aromatic ring and the term "adjacent substituent" may mean a substituent on an atom directly attached to an atom substituted with the corresponding substituent, a substituent disposed sterically closest to the corresponding substituent or another substituent on an atom substituted with the corresponding substituent. For example, two substituents substituted at the ortho position of a benzene ring or two substituents on the same carbon in an aliphatic ring may be considered "adjacent" to each other.

The alkyl groups may be straight or branched. The number of carbon atoms in the alkyl groups is not particularly limited but is preferably 1 to 20. Specific examples of the alkyl groups include, but are not limited to, methyl, ethyl, propyl, n-propyl, isopropyl, butyl, n-butyl, isobutyl, tert-butyl, sec-butyl, 1-methylbutyl, 1-ethylbutyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethylpropyl, isohexyl, 2-methylpentyl, 4-methylhexyl, and 5-methylhexyl groups.

The alkenyl group is intended to include straight and branched ones and may be optionally substituted with one or more other substituents. The alkenyl group may be specifically a vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, stilbenyl or styrenyl group but is not limited thereto.

The alkynyl group is intended to include straight and branched ones and may be optionally substituted with one or more other substituents. The alkynyl group may be, for example, ethynyl or 2-propynyl but is not limited thereto.

The cycloalkyl group is intended to include monocyclic and polycyclic ones and may be optionally substituted with one or more other substituents. As used herein, the term "polycyclic" means that the cycloalkyl group may be directly attached or fused to one or more other cyclic groups. The other cyclic groups may be cycloalkyl groups and other examples thereof include heterocycloalkyl, aryl, and heteroaryl groups. The cycloalkyl group may be specifically a cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl or cyclooctyl group but is not limited thereto.

The heterocycloalkyl group is intended to include monocyclic and polycyclic ones interrupted by a heteroatom such as O, S, Se, N or Si and may be optionally substituted with one or more other substituents. As used herein, the term "polycyclic" means that the heterocycloalkyl group may be directly attached or fused to one or more other cyclic groups. The other cyclic groups may be heterocycloalkyl groups and other examples thereof include cycloalkyl, aryl, and heteroaryl groups.

The aryl groups may be monocyclic or polycyclic ones. Examples of the monocyclic aryl groups include, but are not limited to, phenyl, biphenyl, terphenyl, and stilbenyl groups. Examples of the polycyclic aryl groups include naphthyl, anthracenyl, phenanthrenyl, pyrenyl, perylenyl, tetracenyl, chrysenyl, fluorenyl, acenaphathcenyl, triphenylene, and fluoranthrene groups but the scope of the present invention is not limited thereto.

The heteroaryl groups refer to heterocyclic groups interrupted by one or more heteroatoms. Examples of the heteroaryl groups include, but are not limited to, thiophene, furan, pyrrole, imidazole, triazole, oxazole, oxadiazole, triazole, pyridyl, bipyridyl, pyrimidyl, triazine, triazole, acridyl, pyridazine, pyrazinyl, quinolinyl, quinazoline, quinoxalinyl, phthalazinyl, pyridopyrimidinyl, pyridopyrazinyl, pyrazinopyrazinyl, isoquinoline, indole, carbazole, benzoxazole, benzimidazole, benzothiazole, benzocarbazole, benzothiophene, dibenzothiophene, benzofuranyl, dibenzofuranyl, phenanthroline, thiazolyl, isoxazolyl, oxadiazolyl, thiadiazolyl, benzothiazolyl, and phenothiazinyl groups.

The mixed aliphatic-aromatic rings refer to structures in which at least one aliphatic ring and at least one aromatic ring are linked and fused together and which are overall non-aromatic. The mixed aliphatic-aromatic polycyclic rings may contain one or more heteroatoms selected from N, O, P, and S other than carbon atoms (C).

The alkoxy group may be specifically a methoxy, ethoxy, propoxy, isobutyloxy, sec-butyloxy, pentyloxy, iso-amyloxy or hexyloxy group but is not limited thereto.

The silyl group is intended to include alkyl-substituted silyl groups and aryl-substituted silyl groups. Specific examples of such silyl groups include trimethylsilyl, triethylsilyl, triphenylsilyl, trimethoxysilyl, dimethoxyphenylsilyl, diphenylmethylsilyl, diphenylvinylsilyl, methylcyclobutylsilyl, and dimethylfurylsilyl.

The amine groups may be, for example, $-NH_2$, alkylamine groups, and heteroarylamine groups. The arylamine groups are aryl-substituted amine groups and the alkylamine groups are alkyl-substituted amine groups. Examples of the arylamine groups include substituted or unsubstituted monoarylamine groups, substituted or unsubstituted diarylamine groups, and substituted or unsubstituted triarylamine groups. The aryl moieties in the arylamine groups may be monocyclic or polycyclic ones. The arylamine groups may include two or more aryl moieties. In this case, the aryl moieties may be all either monocyclic or polycyclic ones. Alternatively, the arylamine groups may include one or more monocyclic aryl moieties and one or more polycyclic aryl moieties. The aryl moieties in the arylamine groups may be selected from those exemplified above for the aryl groups.

The aryl moieties in the aryloxy group and the arylthioxy group are the same as those described above for the aryl groups. Specific examples of the aryloxy groups include, but are not limited to, phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, and 9-phenanthryloxy groups. The arylthioxy group may be, for example, a phenylthioxy, 2-methylphenylthioxy or 4-tert-butylphenylthioxy group but is not limited thereto.

The halogen group may be, for example, fluorine, chlorine, bromine or iodine.

More specifically, the polycyclic aromatic derivative represented by Formula A-1 or A-2 according to the present invention may be selected from the following compounds 1 to 63:
1
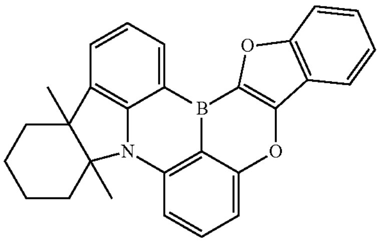
2
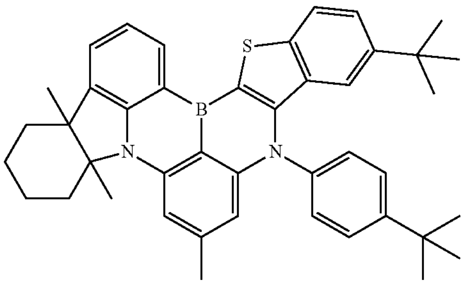
3
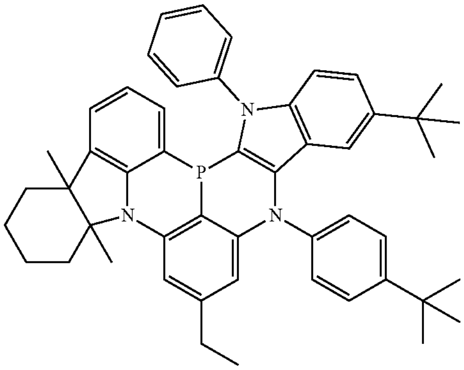
4
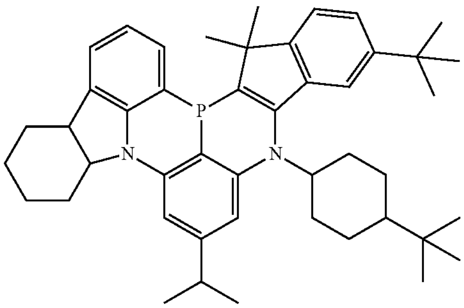
-continued
5
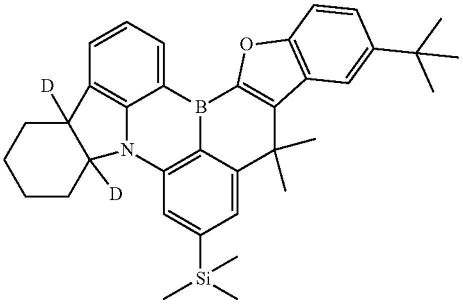
6
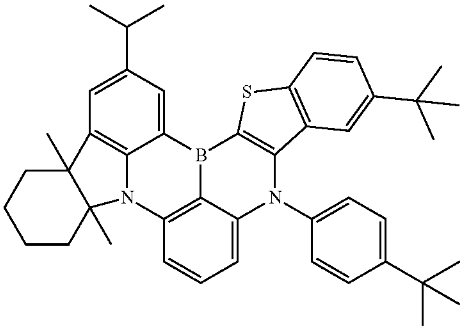
7
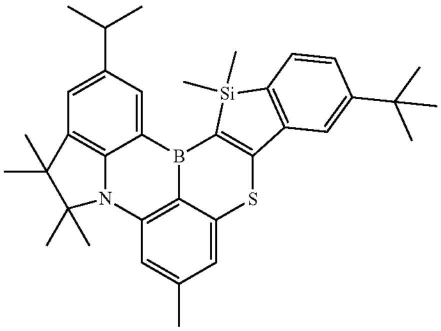
8
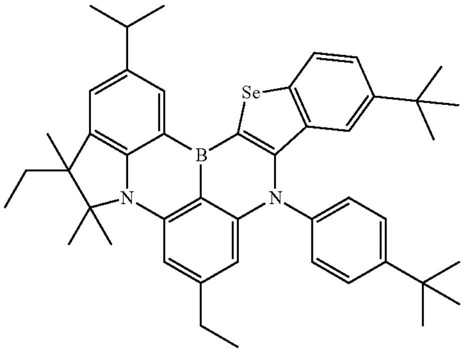

-continued
9
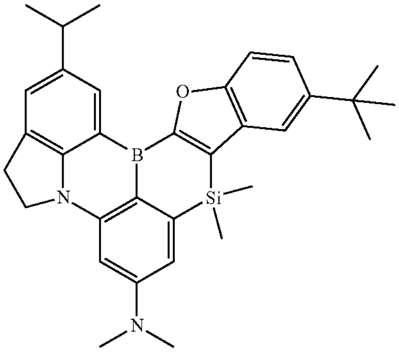
10
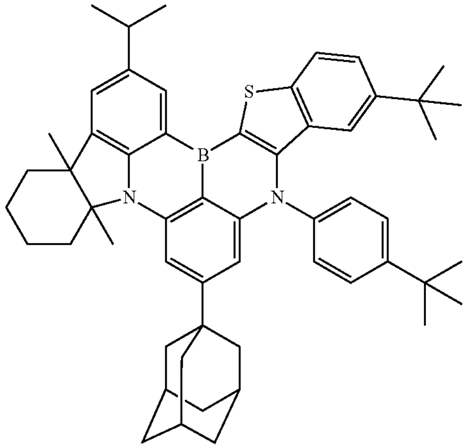
11
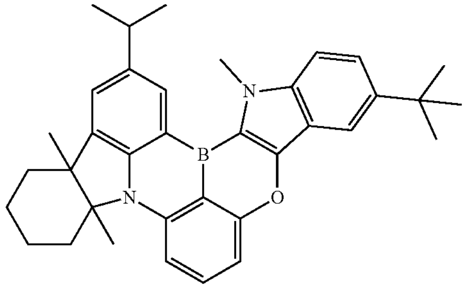
12
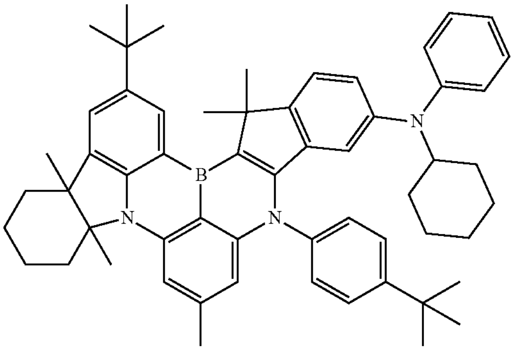
-continued
13
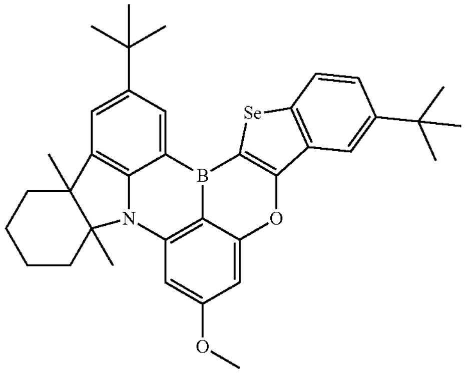
14
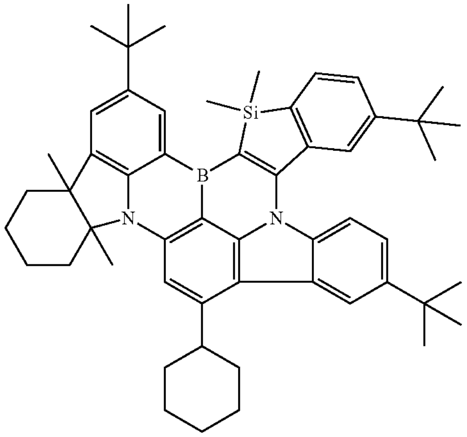
15
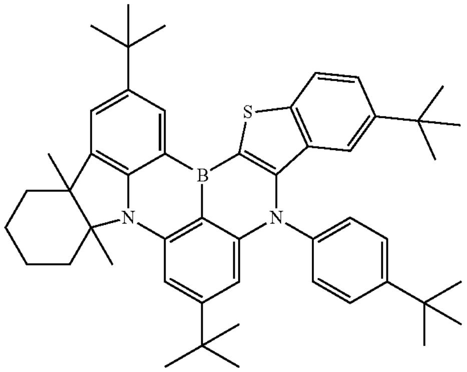
16
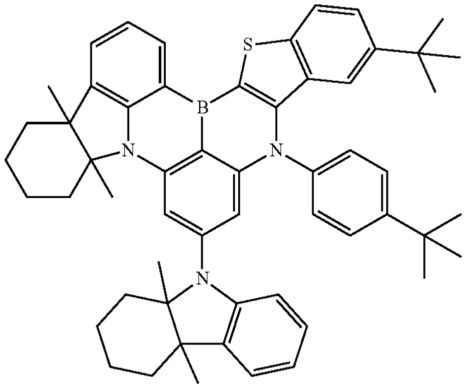

-continued
17
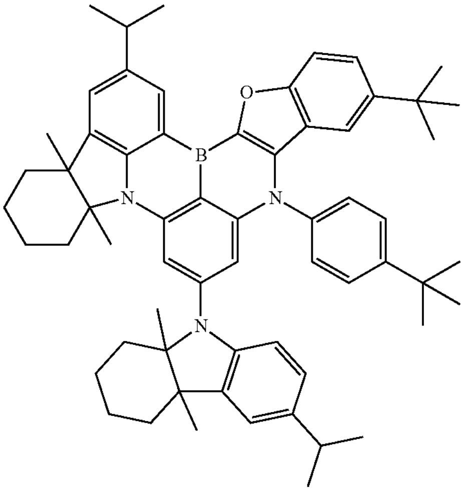
18
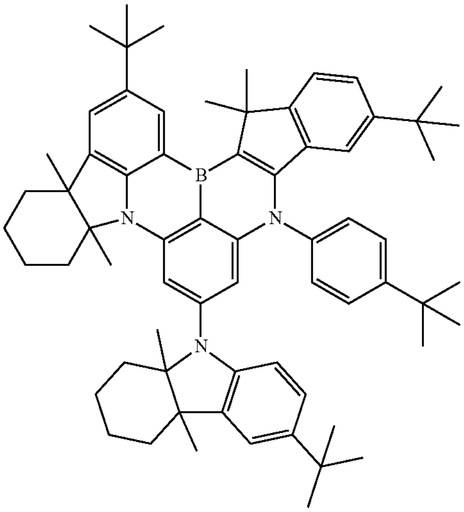
19
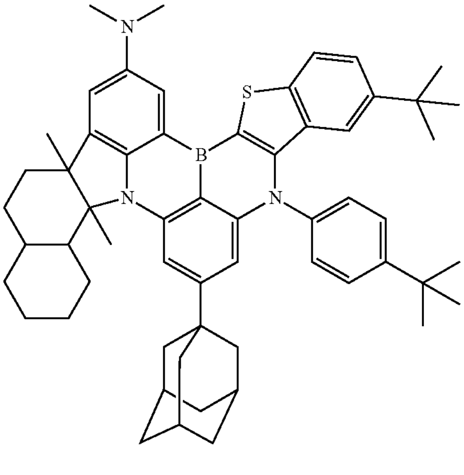
-continued
20
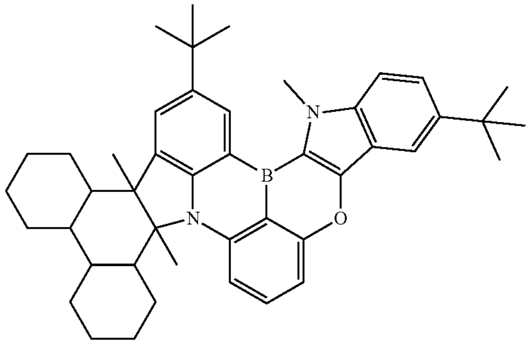
21
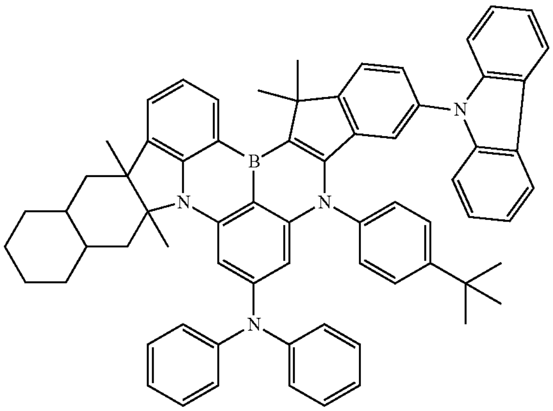
22
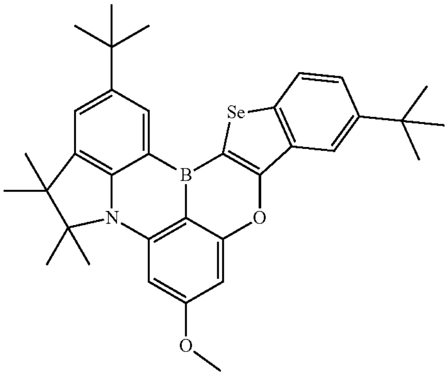
23
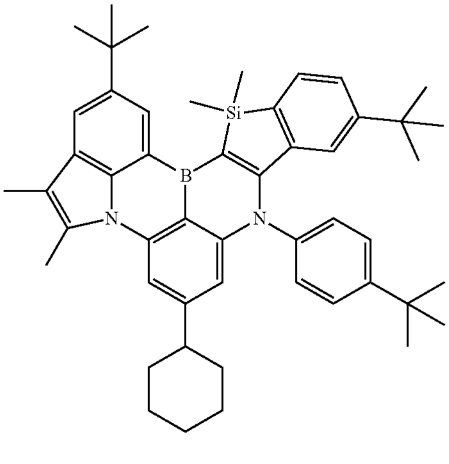

-continued
24
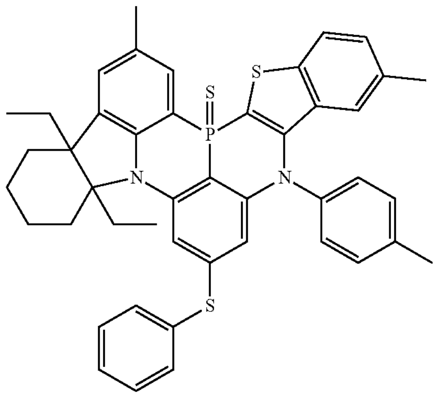
25
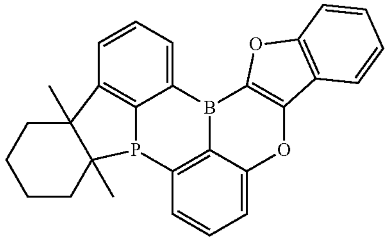
26
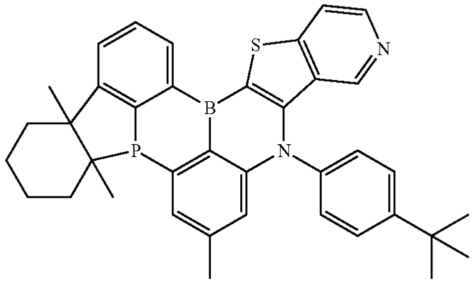
27
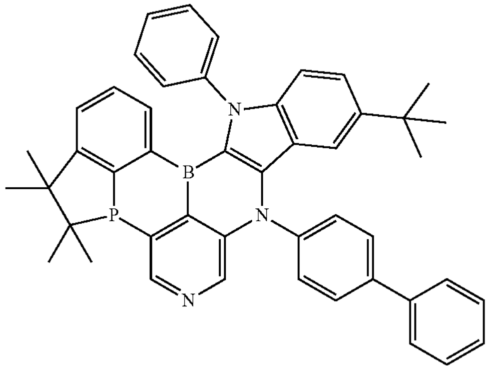
-continued
28
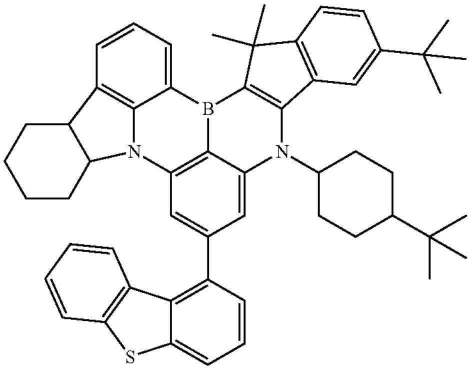
29
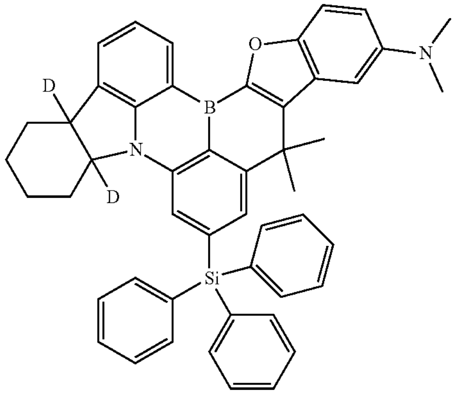
30
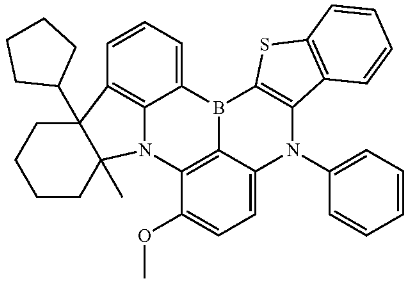
31
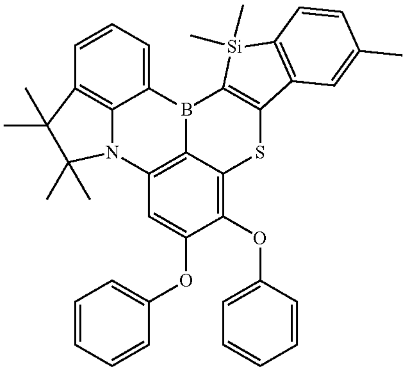

-continued
32
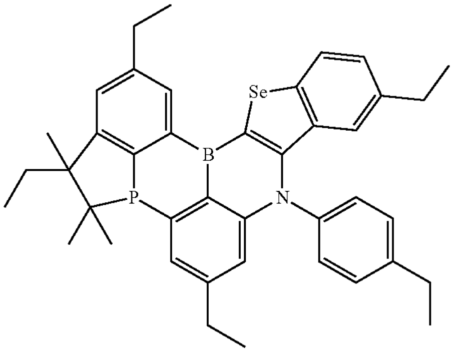
33
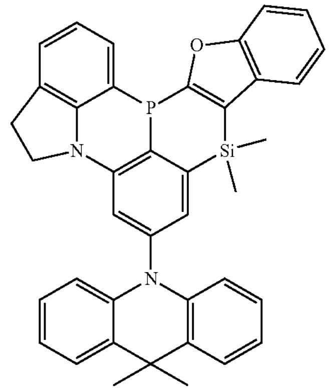
34
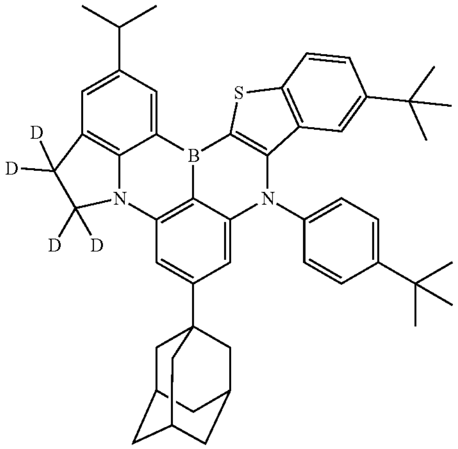
35
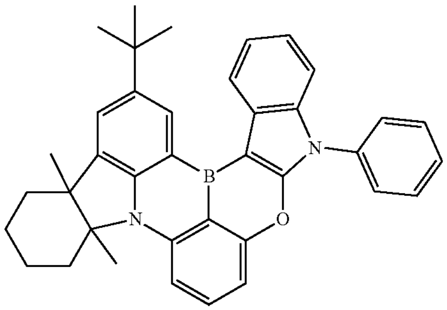
-continued
36
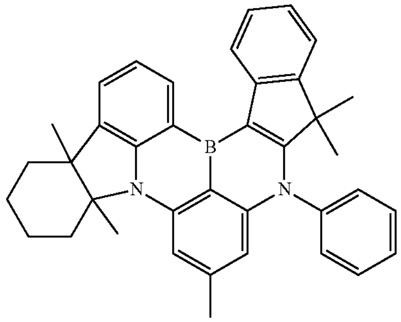
37
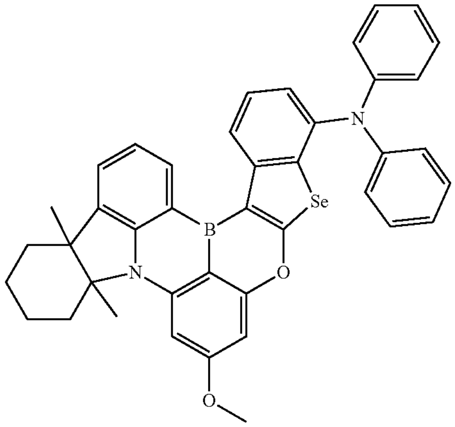
38
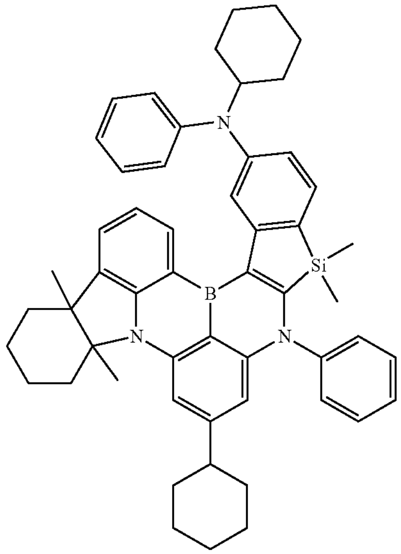
39
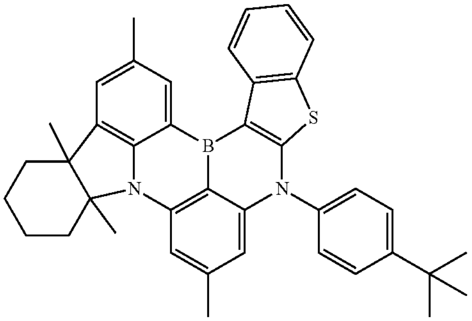

-continued
40
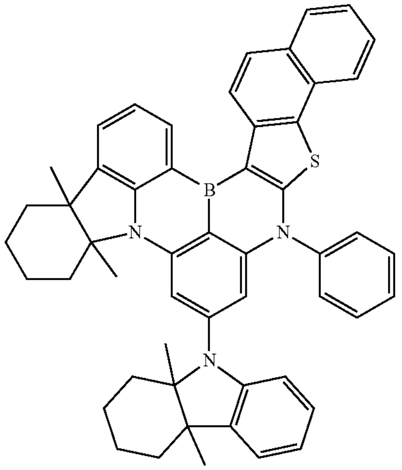
41
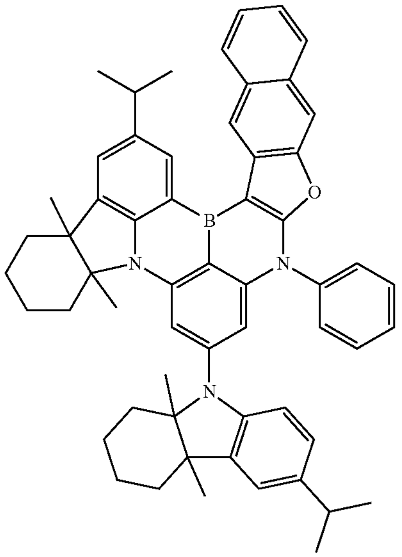
42
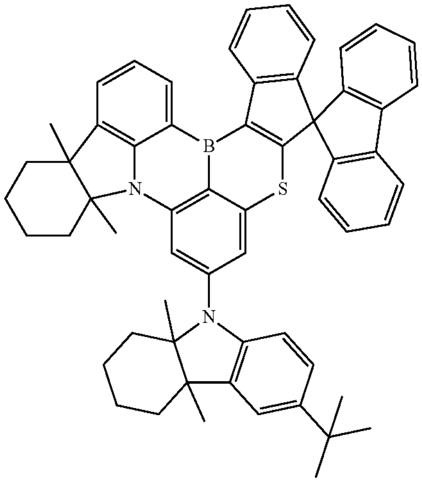
-continued
43
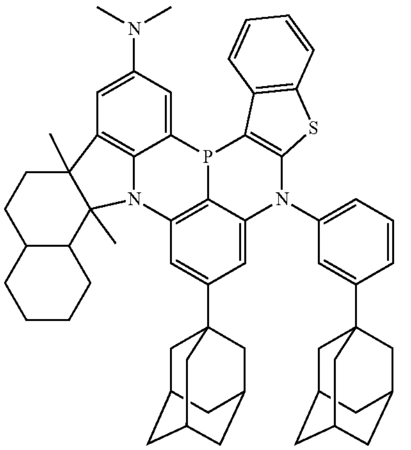
44
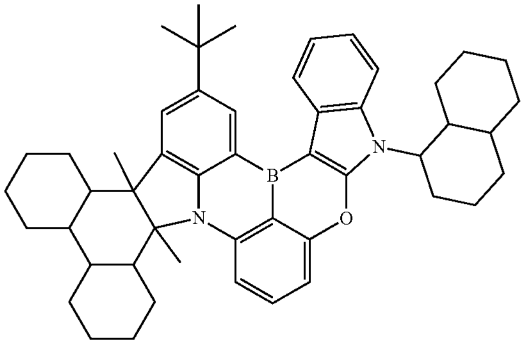
45
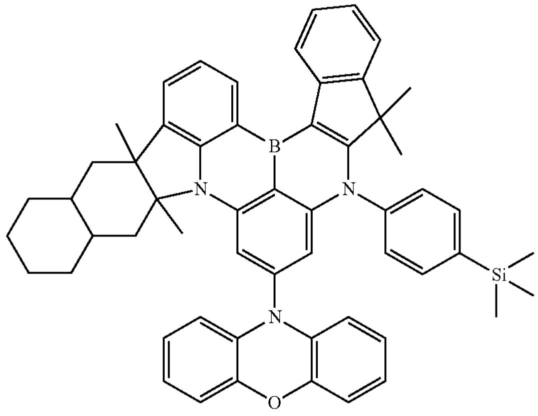
46
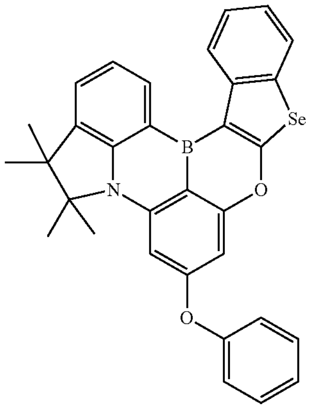

-continued
47
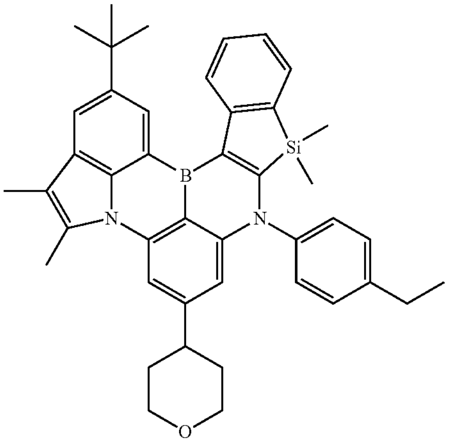
48
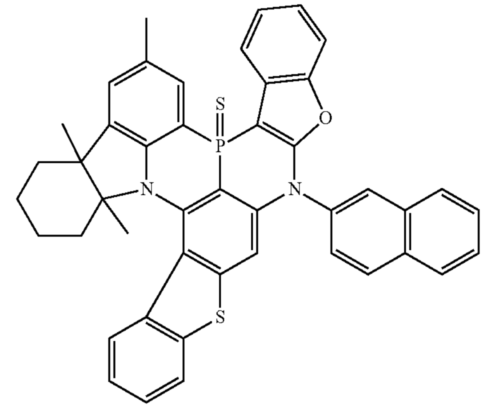
49
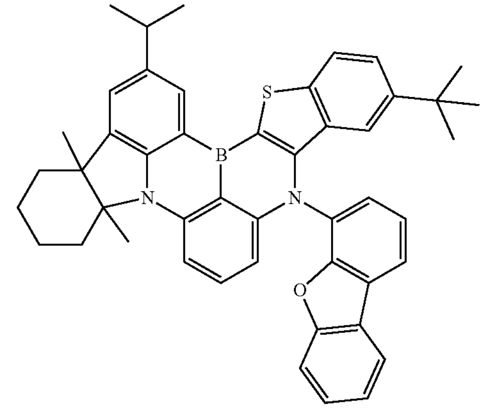
50
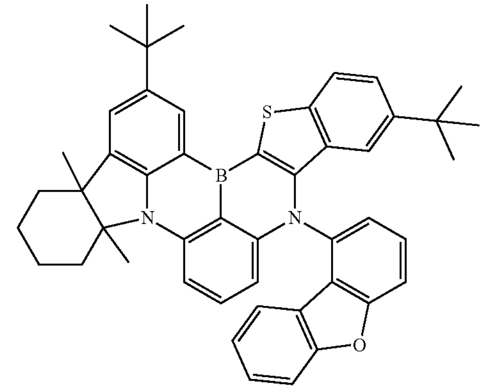
-continued
51
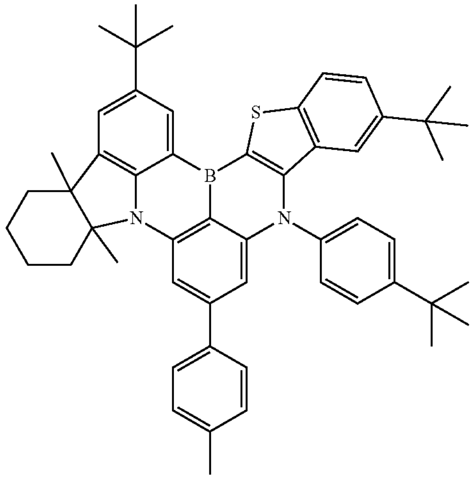
52
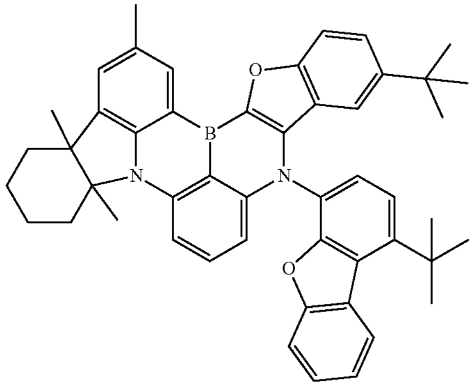
53
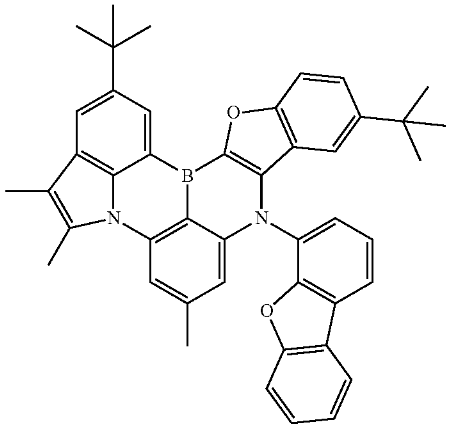

-continued
54
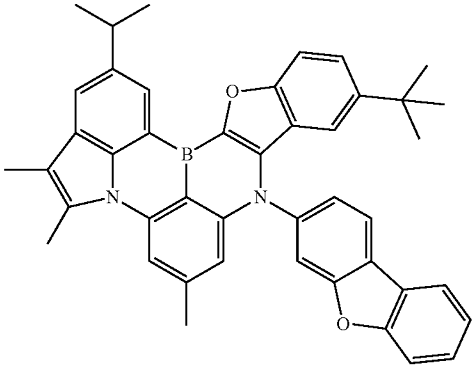
55
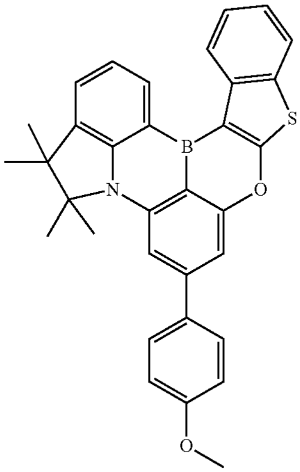
56
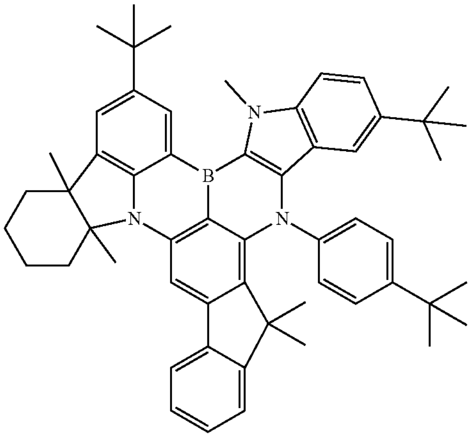
-continued
57
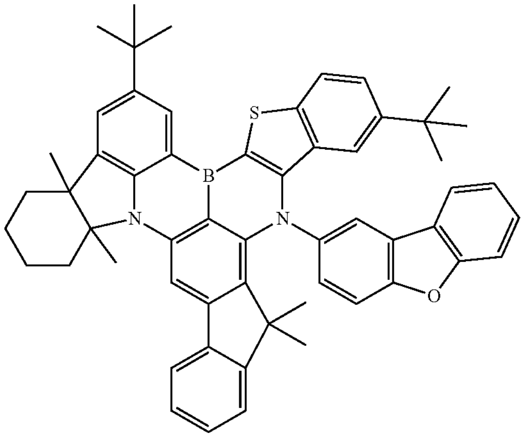
58
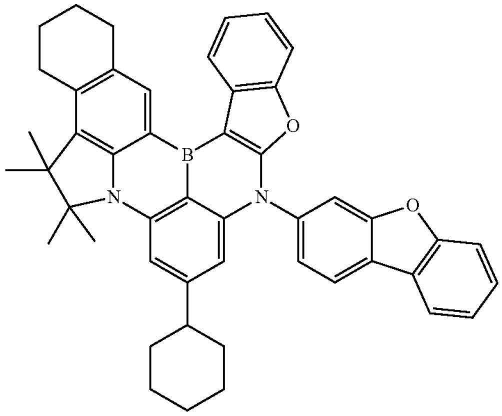
59
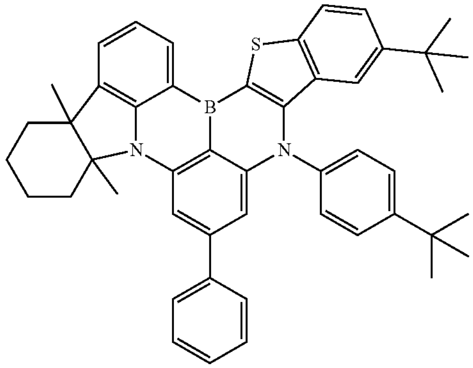

-continued

60

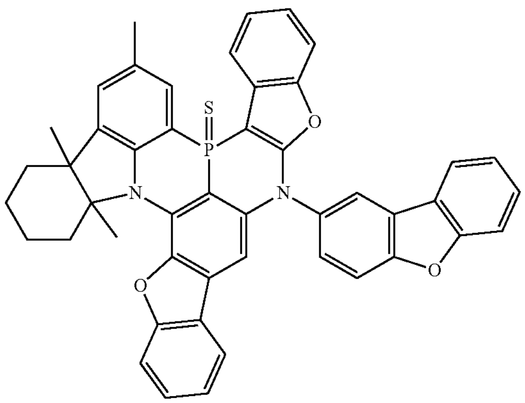

61

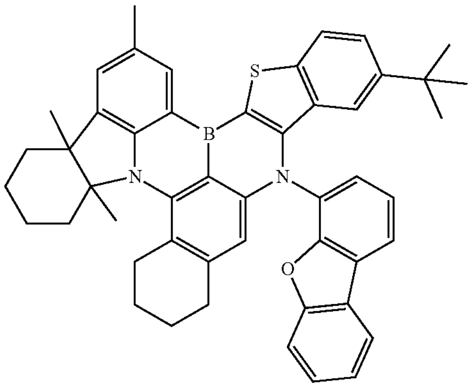

62

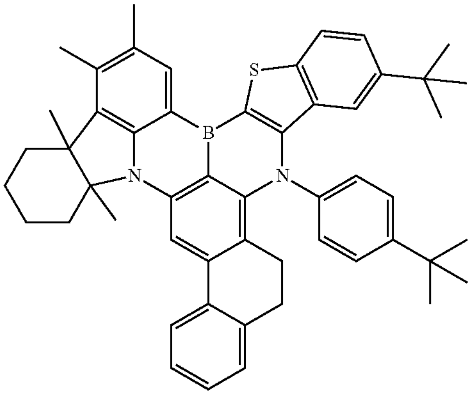

-continued

63

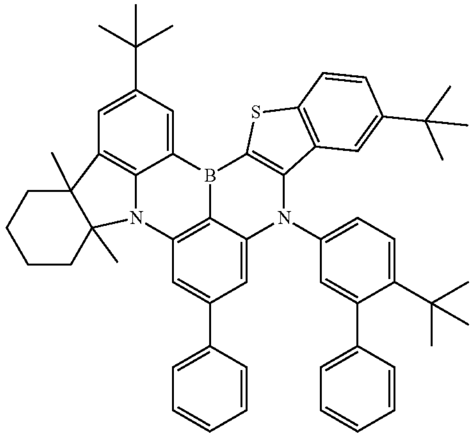

The specific substituents in Formulae A-1 and A-2 can be clearly seen from the structures of the compounds 1 to 63 but are not intended to limit the scope of the compounds represented by Formulae A-1 and A-2.

As can be seen from the above specific compounds, the polycyclic aromatic derivative of the present invention contains B, P or P═O and has a polycyclic aromatic structure. The introduction of substituents into the polycyclic aromatic structure enables the synthesis of organic light emitting materials with inherent characteristics of the substituents. For example, the substituents are designed for use in materials for hole injecting layers, hole transport layers, light emitting layers, electron transport layers, electron injecting layers, electron blocking layers, and hole blocking layers of organic electroluminescent devices. This introduction meets the requirements of materials for the organic layers, making the organic electroluminescent devices highly efficient.

A further aspect of the present invention is directed to an organic electroluminescent device including a first electrode, a second electrode, and one or more organic layers interposed between the first and second electrodes wherein one of the organic layers includes at least one of the organic electroluminescent compounds represented by Formulae A-1 and A-2.

That is, according to one embodiment of the present invention, the organic electroluminescent device has a structure in which one or more organic layers are arranged between a first electrode and a second electrode. The organic electroluminescent device of the present invention may be fabricated by a suitable method known in the art using suitable materials known in the art, except that the organic electroluminescent compound of Formula A-1 or A-2 is used to form the corresponding organic layer.

The organic layers of the organic electroluminescent device according to the present invention may form a monolayer structure. Alternatively, the organic layers may have a multilayer stack structure. For example, the organic layers may have a structure including a hole injecting layer, a hole transport layer, a hole blocking layer, a light emitting layer, an electron blocking layer, an electron transport layer, and an electron injecting layer but is not limited to this structure. The number of the organic layers is not limited and may be increased or decreased. Preferred structures of the organic layers of the organic electroluminescent device according to the present invention will be explained in more detail in the Examples section that follows.

The organic electroluminescent device of the present invention will be described in more detail with reference to exemplary embodiments.

The organic electroluminescent device of the present invention includes an anode, a hole transport layer, a light emitting layer, an electron transport layer, and a cathode. The organic electroluminescent device of the present invention may optionally further include a hole injecting layer between the anode and the hole transport layer and an electron injecting layer between the electron transport layer and the cathode. If necessary, the organic electroluminescent device of the present invention may further include one or two intermediate layers such as a hole blocking layer or an electron blocking layer. The organic electroluminescent device of the present invention may further include one or more organic layers that have various functions depending on the desired characteristics of the device.

The light emitting layer of the organic electroluminescent device according to the present invention includes, as a host compound, an anthracene derivative represented by Formula C:

[Formula C]

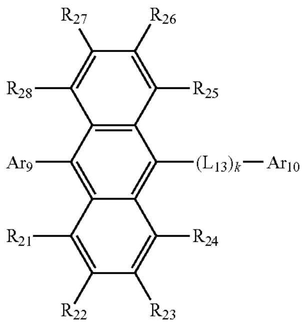

wherein $R_{21}$ to $R_{28}$ are identical to or different from each other and are as defined for $R_1$ to $R_{12}$ in Formula A-1 or A-2, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, preferably a single bond or substituted or unsubstituted $C_6$-$C_{20}$ arylene, and k is an integer from 1 to 3, provided that when k is 2 or more, the linkers $L_{13}$ are identical to or different from each other.

$Ar_9$ in Formula C is represented by Formula C-1:

[Fromula C-1]

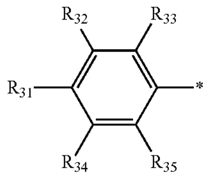

wherein $R_{31}$ to $R_{35}$ are identical to or different from each other and are as defined for $R_1$ to $R_{12}$ in Formula A-1 or A-2 and each of $R_{31}$ to $R_{35}$ is optionally bonded to an adjacent substituent to form a saturated or unsaturated ring.

The compound of Formula C employed in the organic electroluminescent device of the present invention may be specifically selected from the compounds of Formulae C1 to C48:

C1

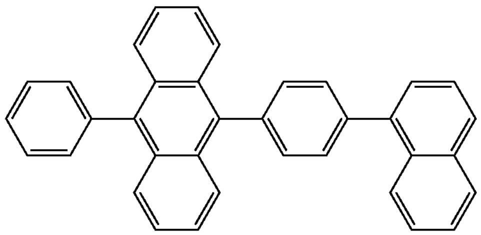

C2

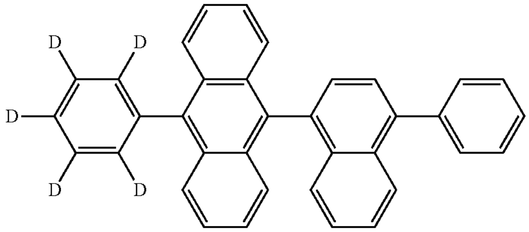

C3

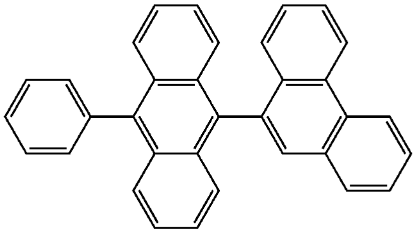

C4

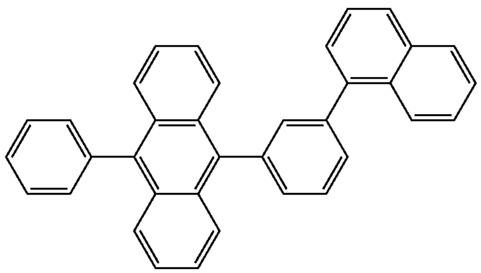

-continued
C5
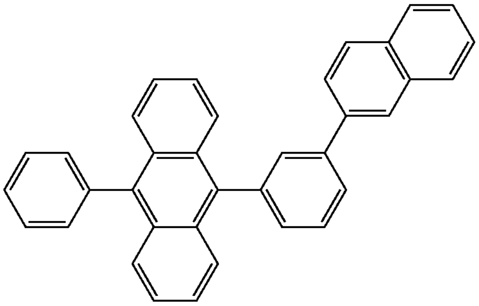
C6
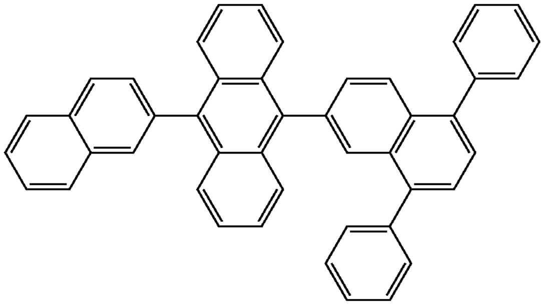
C7
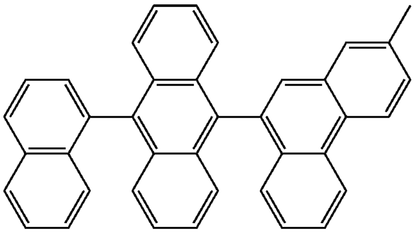
C8
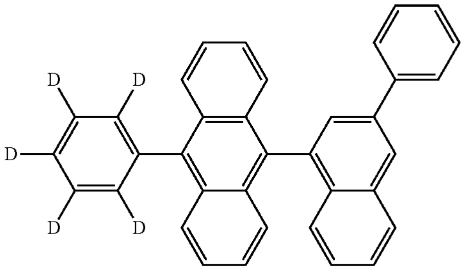
C9
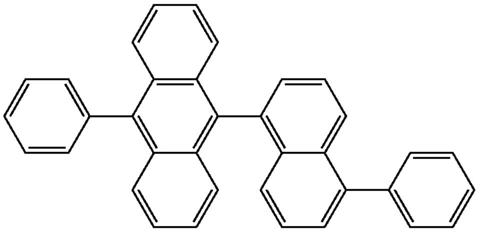
C10
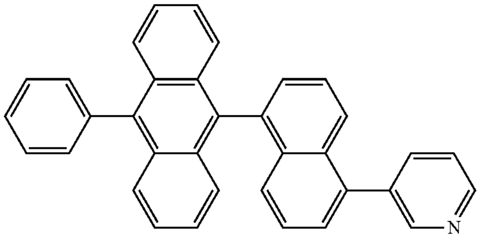
-continued
C11
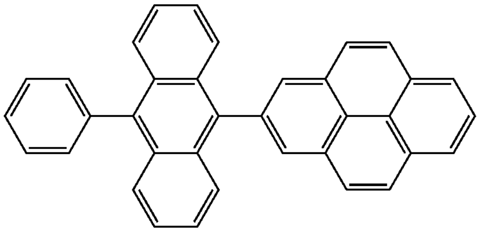
C12
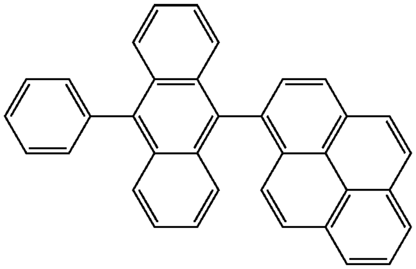
C13
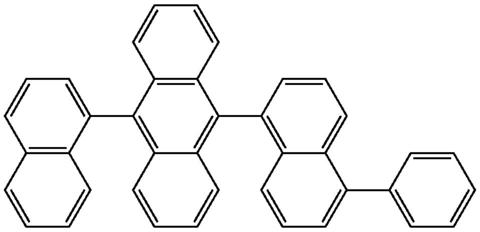
C14
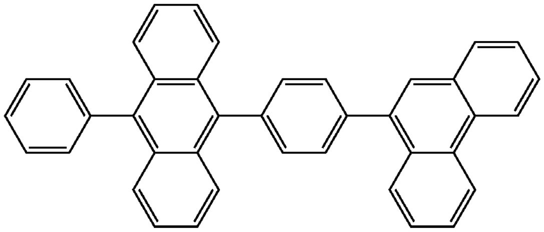
C15
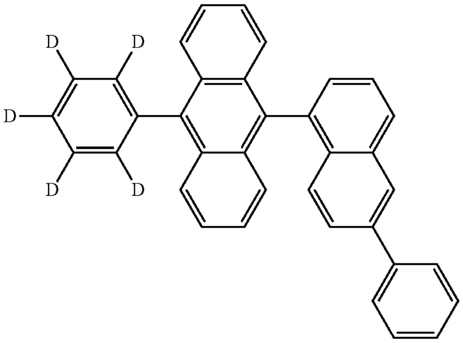

-continued
C16
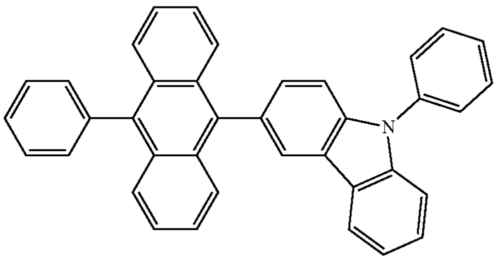
C17
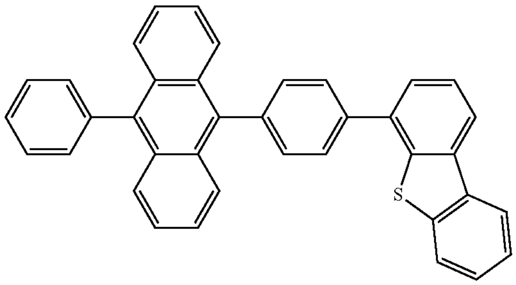
C18
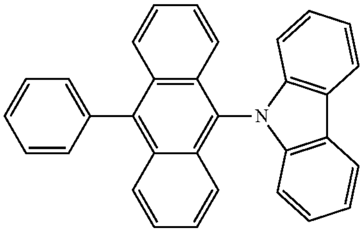
C19
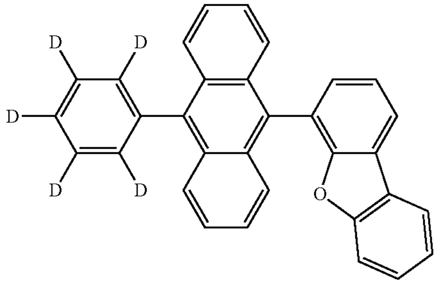
C20
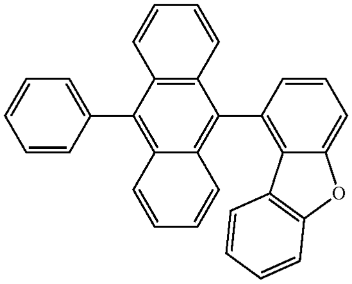
-continued
C21
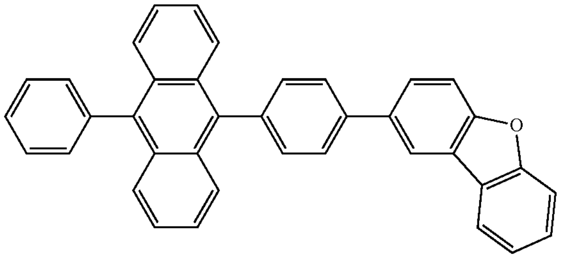
C22
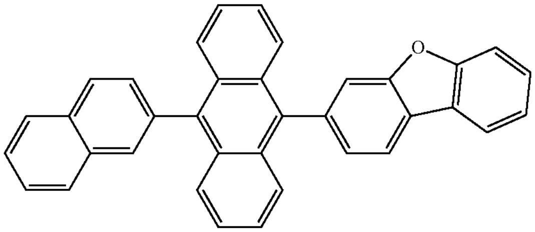
C23
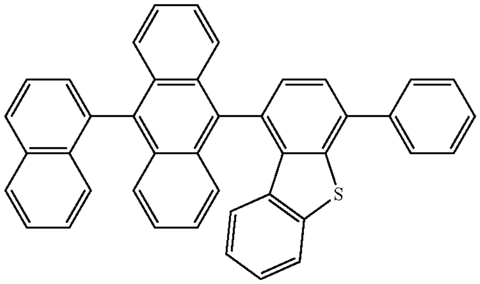
C24
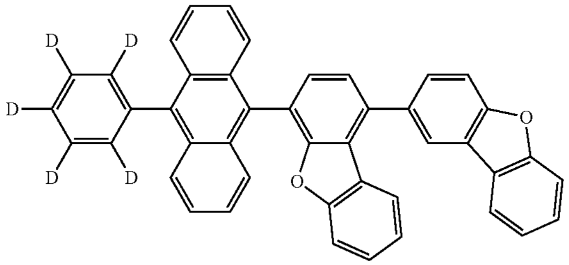
C25
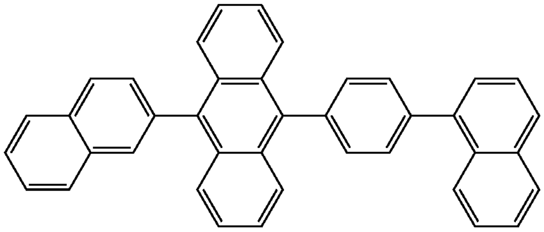

-continued
C26
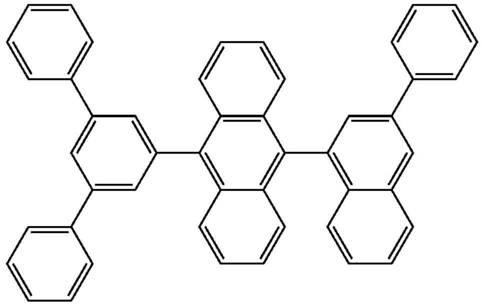
C27
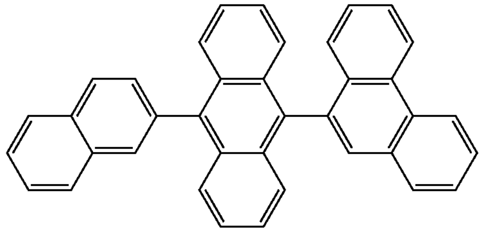
C28
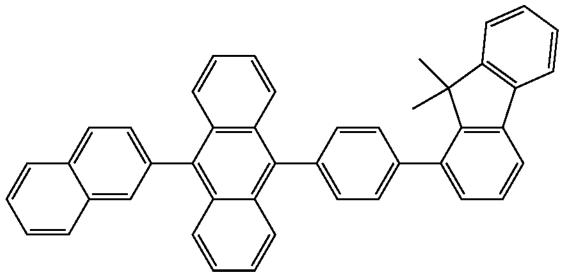
C29
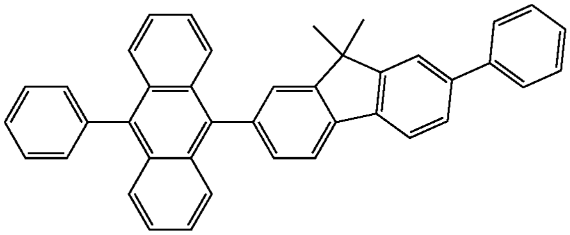
C30
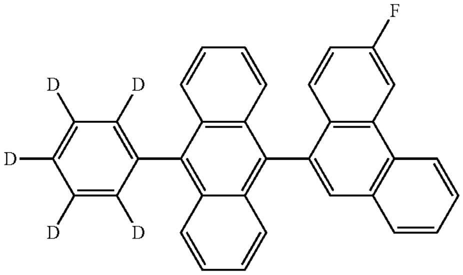
-continued
C31
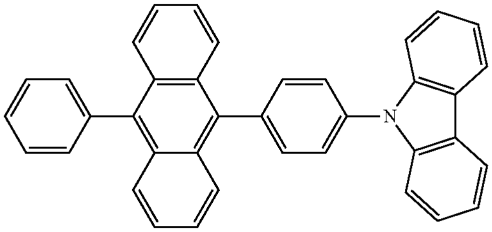
C32
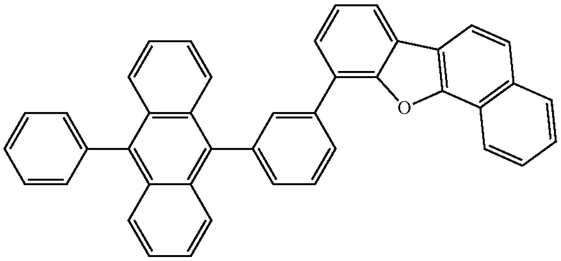
C33
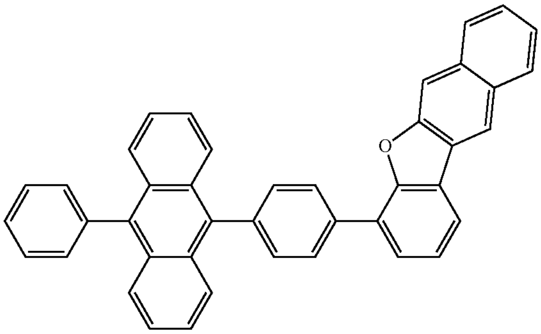
C34
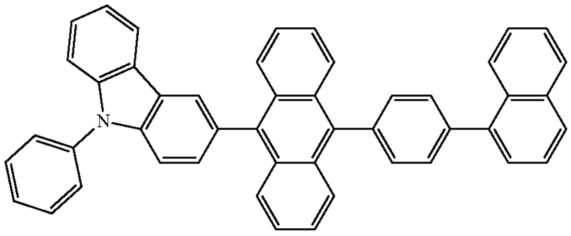
C35
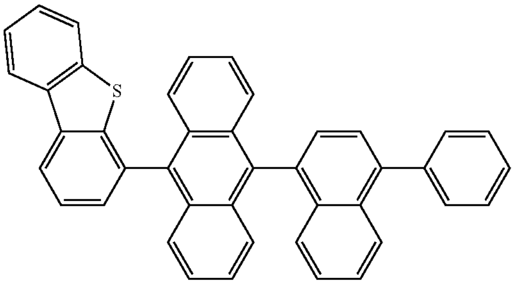

-continued
C36
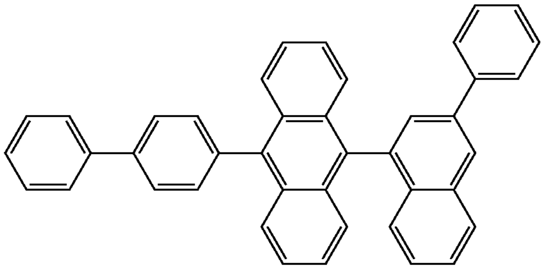
C37
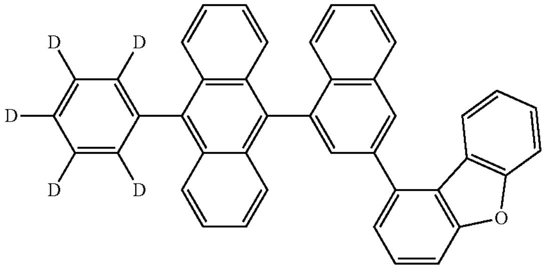
C38
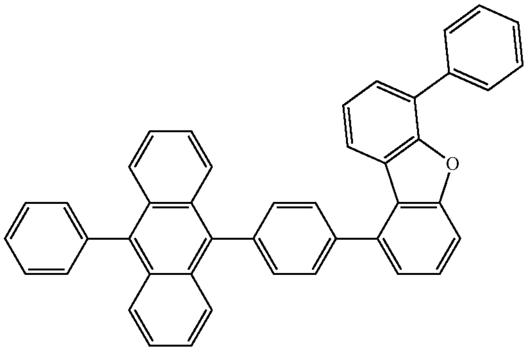
C39
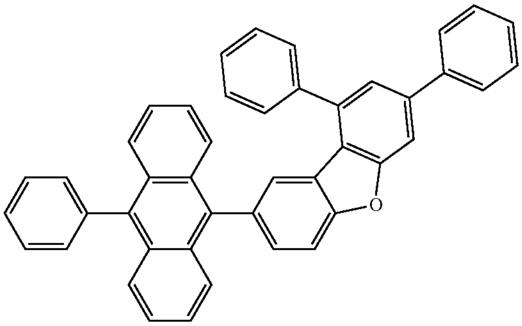
C40
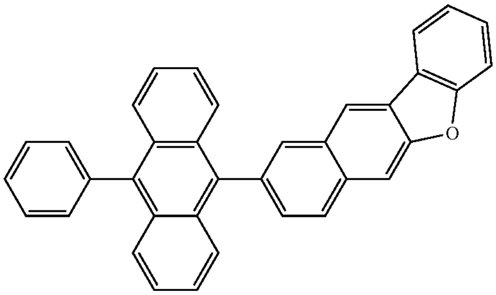
-continued
C41
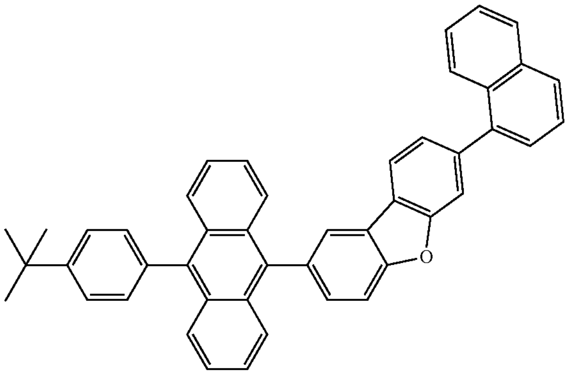
C42
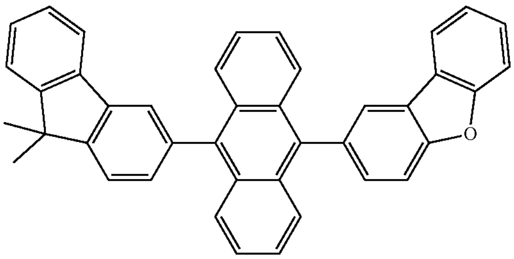
C43
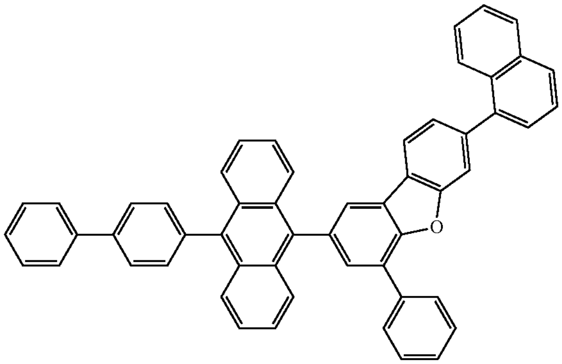
C44
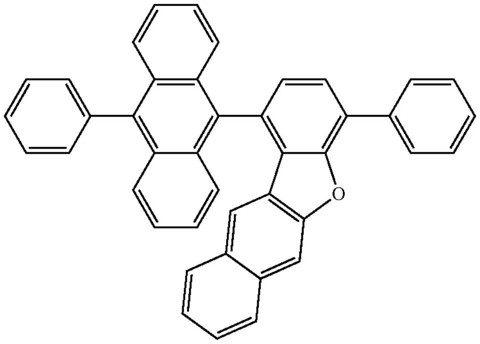

-continued

C45

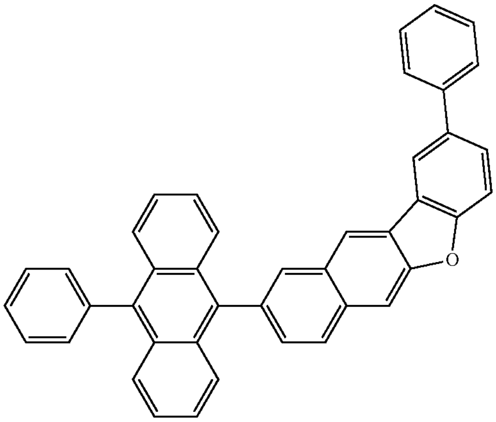

C46

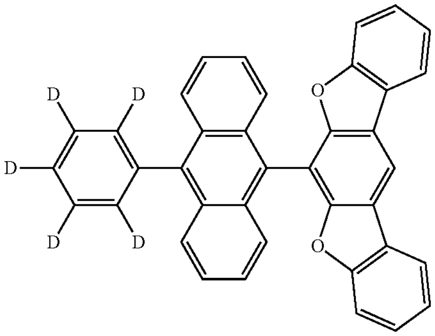

C47

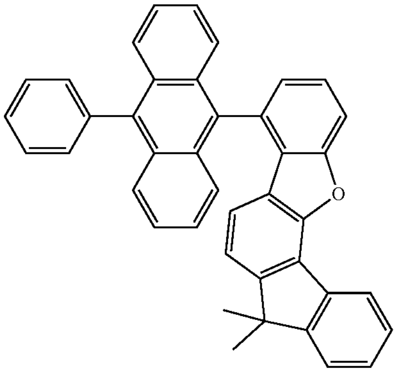

C48

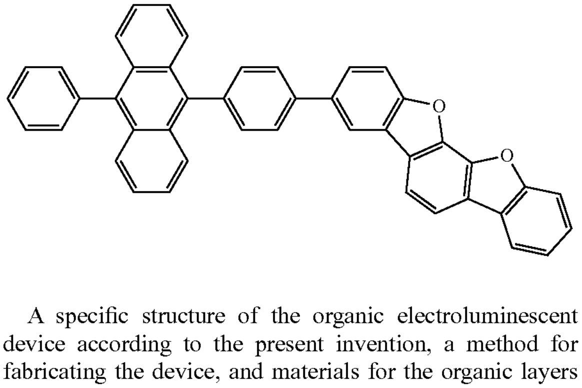

A specific structure of the organic electroluminescent device according to the present invention, a method for fabricating the device, and materials for the organic layers will be described below.

First, an anode material is coated on a substrate to form an anode. The substrate may be any of those used in general electroluminescent devices. The substrate is preferably an organic substrate or a transparent plastic substrate that is excellent in transparency, surface smoothness, ease of handling, and waterproofness. A highly transparent and conductive metal oxide such as indium tin oxide (ITO), indium zine oxide (IZO), tin oxide ($SnO_2$) or zine oxide (ZnO) is used as the anode material.

A hole injecting material is coated on the anode by vacuum thermal evaporation or spin coating to form a hole injecting layer. Then, a hole transport material is coated on the hole injecting layer by vacuum thermal evaporation or spin coating to form a hole transport layer.

The hole injecting material is not specially limited as long as it is usually used in the art. Specific examples of such materials include 4,4',4"-tris(2-naphthylphenyl-phenylamino)triphenylamine (2-TNATA), N,N'-di(1-naphthyl)-N,N'-diphenylbenzidine (NPD), N,N'-diphenyl-N,N'-bis(3-methylphenyl)-1,1'-biphenyl-4,4'-diamine (TPD), and N,N'-diphenyl-N,N'-bis(4-(phenyl-m-tolylamino)phenyl) biphenyl-4,4'-diamine (DNTPD).

The hole transport material is not specially limited as long as it is commonly used in the art. Examples of such materials include N,N'-bis(3-methylphenyl)-N,N'-diphenyl-(1,1-biphenyl)-4,4'-diamine (TPD) and N,N'-di(naphthalen-1-yl)-N,N'-diphenylbenzidine (α-NPD).

Subsequently, a hole auxiliary layer and a light emitting layer are sequentially formed on the hole transport layer. A hole blocking layer may be optionally formed on the light emitting layer by vacuum thermal evaporation or spin coating. The hole blocking layer is formed as a thin film and blocks holes from entering a cathode through the organic light emitting layer. This role of the hole blocking layer prevents the lifetime and efficiency of the device from deteriorating. A material having a very low highest occupied molecular orbital (HOMO) energy level is used for the hole blocking layer. The hole blocking material is not particularly limited as long as it can transport electrons and has a higher ionization potential than the light emitting compound. Representative examples of suitable hole blocking materials include BAlq, BCP, and TPBI.

Examples of materials for the hole blocking layer include, but are not limited to, BAlq, BCP, Bphen, TPBI, NTAZ, $BeBq_2$, OXD-7, and Liq.

An electron transport layer is deposited on the hole blocking layer by vacuum thermal evaporation or spin coating, and an electron injecting layer is formed thereon. A cathode metal is deposited on the electron injecting layer by vacuum thermal evaporation to form a cathode, completing the fabrication of the organic electroluminescent device.

For example, lithium (Li), magnesium (Mg), aluminum (Al), aluminum-lithium (Al—Li), calcium (Ca), magnesium-indium (Mg—In) or magnesium-silver (Mg—Ag) may be used as the metal for the formation of the cathode. The organic electroluminescent device may be of top emission type. In this case, a transmissive material such as ITO or IZO may be used to form the cathode.

A material for the electron transport layer functions to stably transport electrons injected from the cathode. The electron transport material may be any of those known in the art and examples thereof include, but are not limited to, quinoline derivatives, particularly tris(8-quinolinolate)aluminum (Alq3), TAZ, Balq, beryllium bis(benzoquinolin-10-olate (Bebg2), ADN, and oxadiazole derivatives such as PBD, BMD, and BND.

Each of the organic layers can be formed by a monomolecular deposition or solution process. According to the monomolecular deposition process, the material for each layer is evaporated into a thin film under heat and vacuum or reduced pressure. According to the solution process, the material for each layer is mixed with a suitable solvent, and then the mixture is formed into a thin film by a suitable method such as ink-jet printing, roll-to-roll coating, screen printing, spray coating, dip coating or spin coating.

The organic electroluminescent device of the present invention can be used in a display or lighting system selected from flat panel displays, flexible displays, monochromatic flat panel lighting systems, white flat panel lighting systems, flexible monochromatic lighting systems, and flexible white lighting systems.

MODE FOR INVENTION

The present invention will be explained more specifically with reference to the following examples. However, it will be obvious to those skilled in the art that these examples are in no way intended to limit the scope of the invention.

Synthesis Example 1. Synthesis of Compound 2

Synthesis Example 1-1. Synthesis of Intermediate 1-a

Intermediate 1-a was synthesized by Reaction 1.

[Reaction 1]

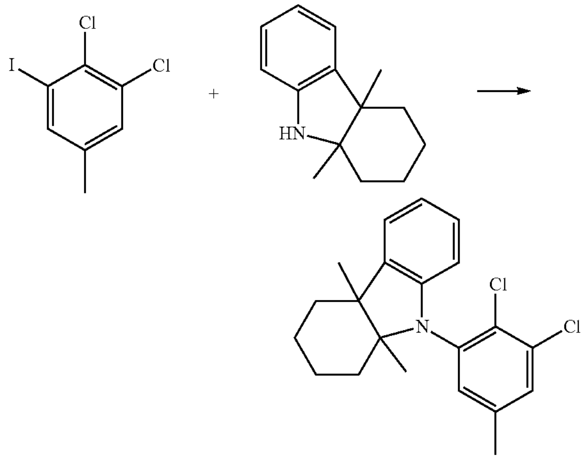

Intermediate 1-a 30 g (105 mmol) of 1,2-dichloro-3-iodo-5-methylbenzene, 21 g (105 mmol) of 4a,9a-dimethyl-2,3,4,4a,9,9a-hexahydro-1H-carbazole, 3.3 g (31 mmol) of sodium bisulfite, 2.6 g (10 mmol) of 3,5-bis-tert-butylsalicylic acid, 43.3 g (314 mmol) of potassium carbonate, 0.7 g (10 mmol) of copper, and 90 mL of dodecylbenzene were stirred in a 300 mL reactor at 220° C. for 24 h. After cooling to room temperature, water was poured into the reaction mixture. The resulting mixture was stirred and filtered through Celite. The filtrate was extracted with ethyl acetate and water. The organic layer was concentrated under reduced pressure and separated by column chromatography to afford 20 g (yield 53%) of Intermediate 1-a.

Synthesis Example 1-2. Synthesis of Intermediate 1-b

Intermediate 1-b was synthesized by Reaction 2.

[Reaction 2]

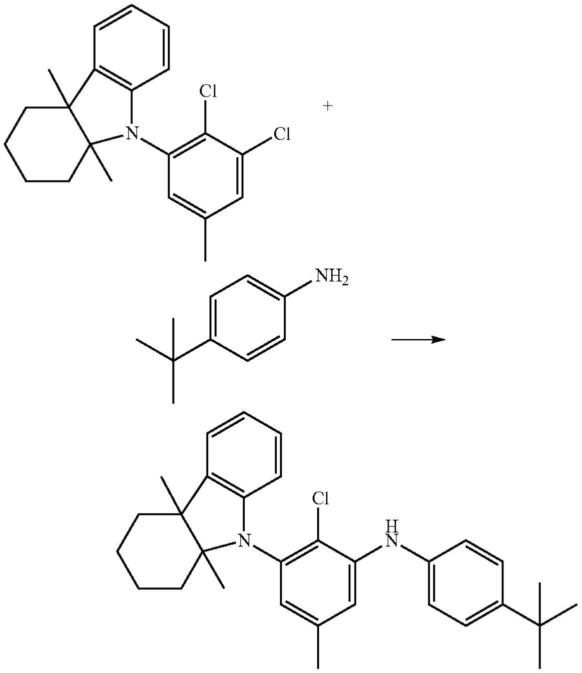

Intermediate 1-b 20 g (56 mmol) of Intermediate 1-a, 10 g (67 mmol) of 4-tert-butylaniline, 1.5 g (2 mmol) of tris(dibenzylideneacetone)dipalladium(0), 2.4 g (8 mmol) of tri-tert-butylphosphonium tetrafluoroborate, 10.7 g (112 mmol) of sodium tert-butoxide, and 200 mL of toluene were placed in a 500 mL reactor. The mixture was stirred under reflux for 24 h. After completion of the reaction, the reaction solution was filtered, concentrated under reduced pressure, and separated by column chromatography to afford 25 g (yield 94%) of Intermediate 1-b.

Synthesis Example 1-3. Synthesis of Intermediate 1-c

Intermediate 1-c was synthesized by Reaction 3.

[Reaction 3]

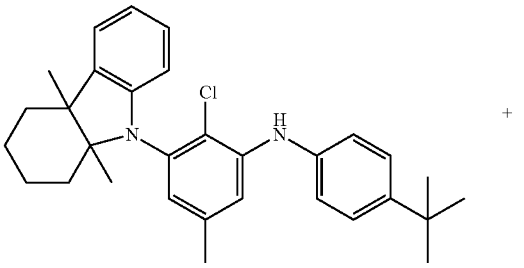

-continued

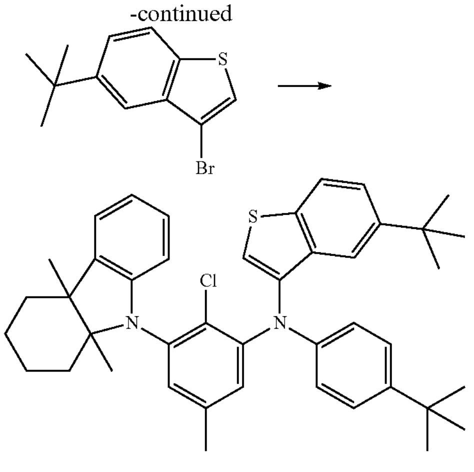

Intermediate 1-c 25 g (53 mmol) of Intermediate 1-b, 17.1 g (63 mmol) of 3-bromo-5-tert-butyl-1-benzothiophene, 1.0 g (1 mmol) of tris(dibenzylideneacetone)dipalladium(0), 1.5 g (5 mmol) of tri-tert-butylphosphonium tetrafluoroborate, 10.2 g (106 mmol) of sodium tert-butoxide, and 250 mL of toluene were placed in a 500 mL reactor. The mixture was stirred under reflux for 24 h. After completion of the reaction, the reaction solution was filtered, concentrated under reduced pressure, and separated by column chromatography to afford 30.8 g (yield 88%) of Intermediate 1-c.

Synthesis Example 1-4. Synthesis of Compound 2

Compound 2 was synthesized by Reaction 4.

[Reaction 4]

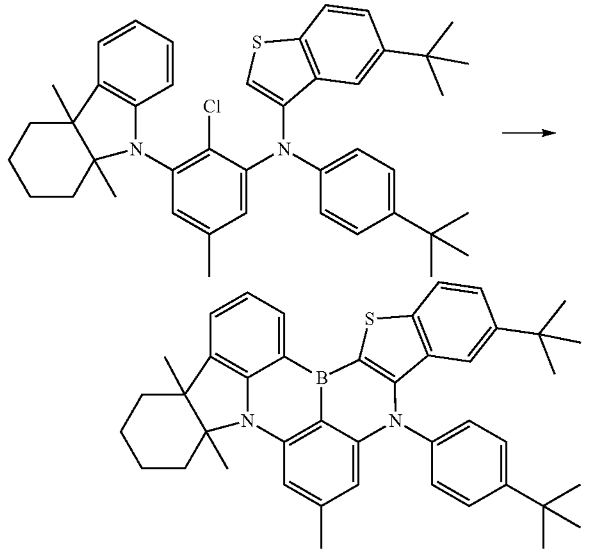

Compound 2

30.8 g (47 mmol) of Intermediate 1-c and 370 mL of tert-butylbenzene were placed in a 1 L reactor and 82.2 mL (140 mmol) of 1.7 M tert-butyllithium (in pentane) was added dropwise thereto at −78° C. After addition was finished, nitrogen was blown into the mixture with stirring at 60° C. for 2 h to remove pentane. After dropwise addition of 23.3 g (93 mmol) of boron tribromide at −78° C., the mixture was stirred at room temperature for 1 h. To the mixture was added dropwise 12.0 g (93 mmol) of N,N-diisopropylethylamine at 0° C. The resulting mixture was stirred at 120° C. overnight. After completion of the reaction, an aqueous sodium acetate solution was added at room temperature, followed by stirring. The reaction mixture was extracted with dichloromethane. The organic layer was concentrated and separated by column chromatography to give 5.1 g (yield 17%) of Compound 2.

MS (MALDI-TOF): m/z 634.36 [$M^+$]

Synthesis Example 2. Synthesis of Compound 6

Synthesis Example 2-1. Synthesis of Intermediate 2-a

Intermediate 2-a was synthesized by Reaction 5.

[Reaction 5]

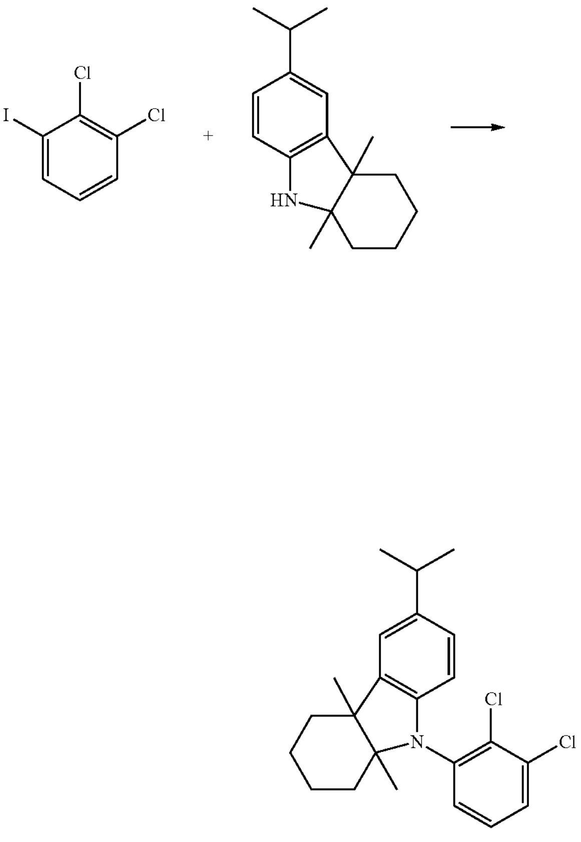

Intermediate 2-a 21.6 g (yield 53%) of Intermediate 2-a was synthesized in the same manner as in Synthesis Example 1-1, except that 1,2-dichloro-3-iodobenzene and 6-isopropyl-4a,9a-dimethyl-2,3,4,4a,9,9a-hexahydro-1H-carbazole were used instead of 1,2-dichloro-3-iodo-5-methylbenzene and 4a,9a-dimethyl-2,3,4,4a,9,9a-hexahydro-1H-carbazole, respectively.

Synthesis Example 2-2. Synthesis of Intermediate 2-b

Intermediate 2-b was synthesized by Reaction 6.

[Reaction 6]

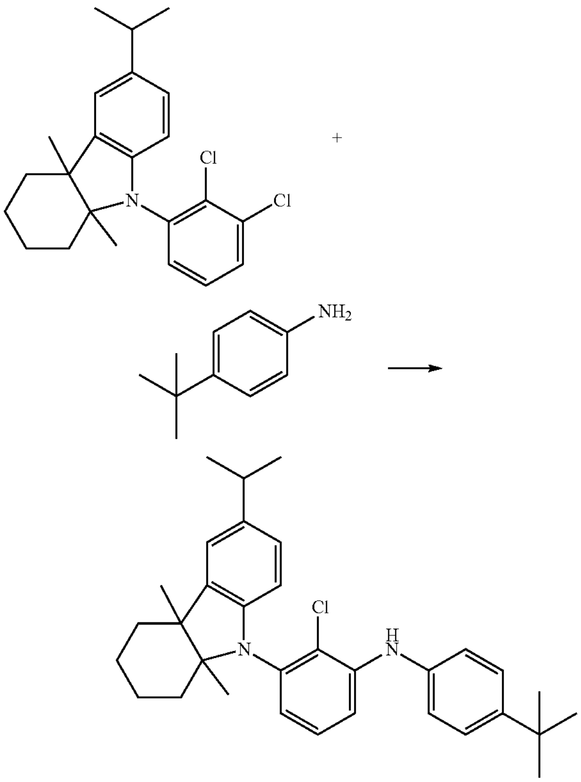

Intermediate 2-b 26 g (yield 94%) of Intermediate 2-b was synthesized in the same manner as in Synthesis Example 1-2, except that Intermediate 2-a was used instead of Intermediate 1-a.

Synthesis Example 2-3. Synthesis of Intermediate 2-c

Intermediate 2-c was synthesized by Reaction 7.

[Reaction 7]

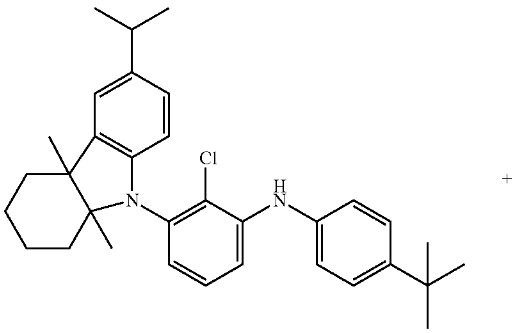

-continued

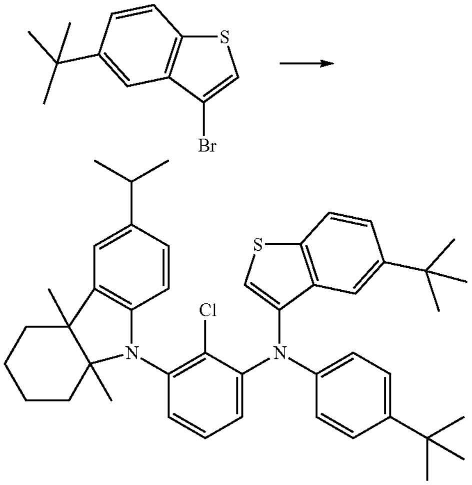

Intermediate 2-c 32 g (yield 88%) of Intermediate 2-c was synthesized in the same manner as in Synthesis Example 1-3, except that Intermediate 2-b was used instead of Intermediate 1-b.

Synthesis Example 2-4. Synthesis of Compound 6

Compound 6 was synthesized by Reaction 8.

[Reaction 8]

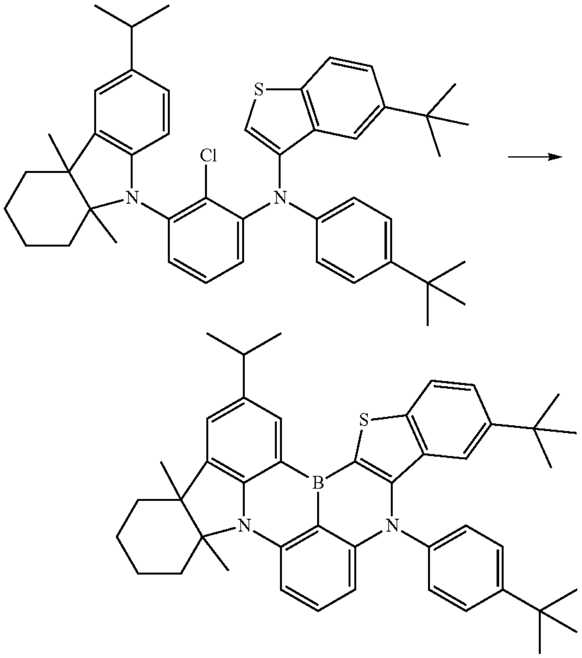

Compound 6

5.3 g (yield 17%) of Compound 6 was synthesized in the same manner as in Synthesis Example 1-4, except that Intermediate 2-c was used instead of Intermediate 1-c.

MS (MALDI-TOF): m/z 662.40 [$M^+$]

Synthesis Example 3. Synthesis of Compound 15

Synthesis Example 3-1. Synthesis of Intermediate 3-a

Intermediate 3-a was synthesized by Reaction 9.

[Reaction 9]

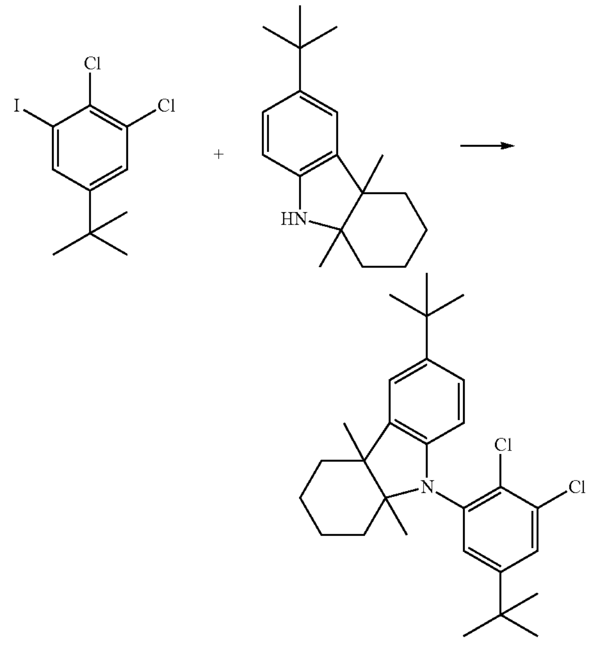

Intermediate 3-a 25.5 g (yield 53%) of Intermediate 3-a was synthesized in the same manner as in Synthesis Example 1-1, except that 1,2-dichloro-3-iodo-5-tert-butylbenzene and 6-tert-butyl-4a,9a-dimethyl-2,3,4,4a,9,9a-hexahydro-1H-carbazole were used instead of 1,2-dichloro-3-iodo-5-methylbenzene and 4a,9a-dimethyl-2,3,4,4a,9,9a-hexahydro-1H-carbazole, respectively.

Synthesis Example 3-2. Synthesis of Intermediate 3-b

Intermediate 3-b was synthesized by Reaction 10.

[Reaction 10]

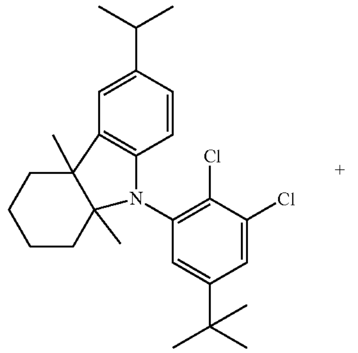

-continued

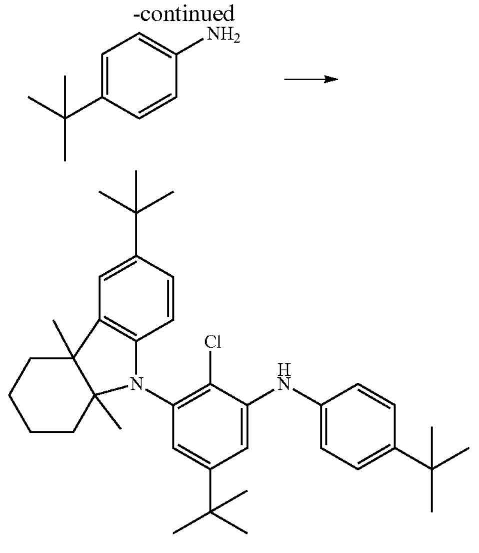

Intermediate 3-b 30 g (yield 94%) of Intermediate 3-b was synthesized in the same manner as in Synthesis Example 1-2, except that Intermediate 3-a was used instead of Intermediate 1-a.

Synthesis Example 3-3. Synthesis of Intermediate 3-c

Intermediate 3-c was synthesized by Reaction 11.

[Reaction 11]

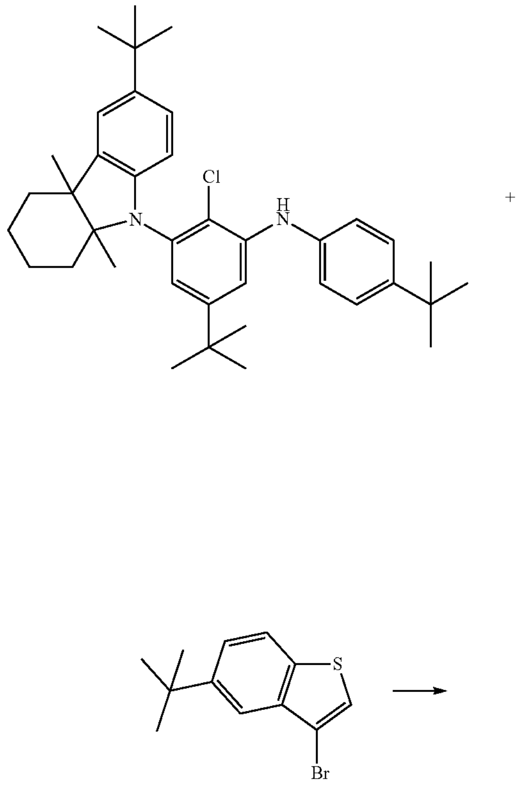

-continued

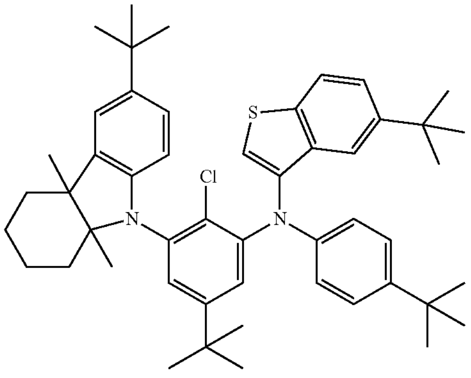

Intermediate 3-c 35.4 g (yield 88%) of Intermediate 3-c was synthesized in the same manner as in Synthesis Example 1-3, except that Intermediate 3-b was used instead of Intermediate 1-b.

Synthesis Example 3-4. Synthesis of Compound 15

Compound 15 was synthesized by Reaction 12.

[Reaction 12]

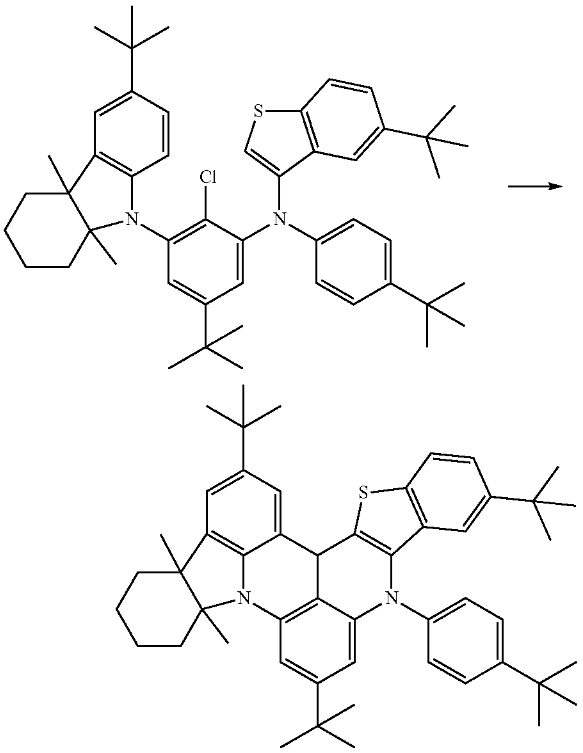

Compound 15

5.9 g (yield 17%) of Compound 15 was synthesized in the same manner as in Synthesis Example 1-4, except that Intermediate 3-c was used instead of Intermediate 1-c.

MS (MALDI-TOF): m/z 732.46 [$M^+$]

Synthesis Example 4. Synthesis of Compound 16

Synthesis Example 4-1. Synthesis of Intermediate 4-a

Intermediate 4-a was synthesized by Reaction 13.

[Reaction 13]

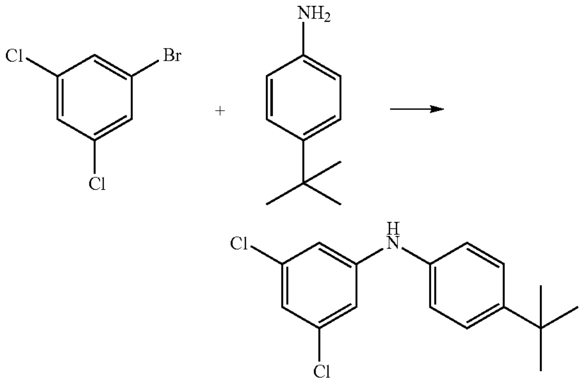

Intermediate 4-a 50 g (221 mmol) of 1-bromo-3,5-dichlorobenzene, 27.5 g (184 mmol) of tert-butylaniline, 3.37 g (3.68 mmol) of tris(dibenzylideneacetone)dipalladium(0), 26.5 g (276 mmol) of sodium tert-butoxide, 4.59 g (7.36 mmol) of bis(diphenylphosphino)-1,1'-binaphthyl, and 500 mL of toluene were placed in a 1 L reactor. The mixture was stirred under reflux for 24 h. After completion of the reaction, the reaction solution was filtered. The filtrate was concentrated and separated by column chromatography to afford 47 g (yield 87%) of Intermediate 4-a.

Synthesis Example 4-2. Synthesis of Intermediate 4-b

Intermediate 4-b was synthesized by Reaction 14.

[Reaction 14]

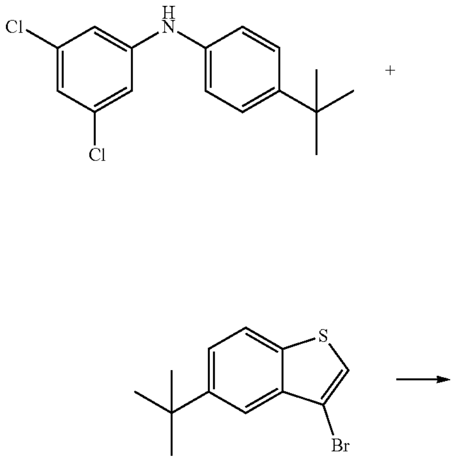

-continued

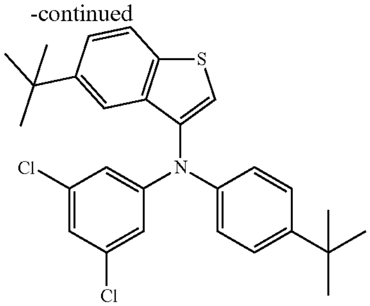

Intermediate 4-b 68 g (yield 88%) of Intermediate 4-b was synthesized in the same manner as in Synthesis Example 1-3, except that Intermediate 4-a was used instead of Intermediate 1-b.

Synthesis Example 4-3. Synthesis of Intermediate 4-c

Intermediate 4-c was synthesized by Reaction 15.

[Reaction 15]

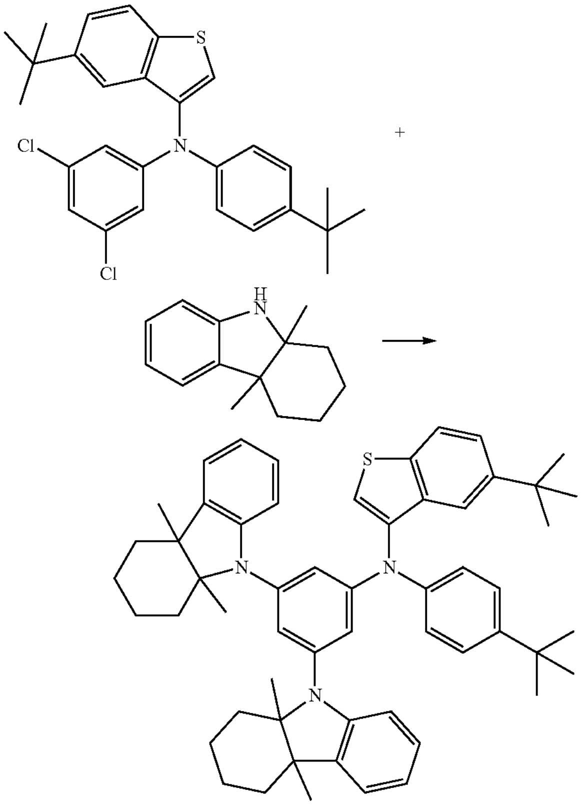

Intermediate 4-c 30 g (62 mmol) of Intermediate 4-b, 31.2 g (155 mmol) of 4a,9a-dimethyl-2,3,4,4a,9,9a-hexahydro-1H-carbazole, 2.3 g (2.48 mmol) of tris(dibenzylideneacetone)dipalladium (0), 17.9 g (186 mmol) of sodium tert-butoxide, 1 g (4.96 mmol) of tri-tert-butylphosphine, and 300 mL of toluene were placed in a 500 mL reactor. The mixture was stirred under reflux for 24 h. After completion of the reaction, the reaction solution was extracted with ethyl acetate. The organic layer was concentrated and separated by column chromatography to afford 45.8 g of (yield 91%) of Intermediate 4-c.

Synthesis Example 4-4. Synthesis of Compound 16

Compound 16 was synthesized by Reaction 16.

[Reaction 16]

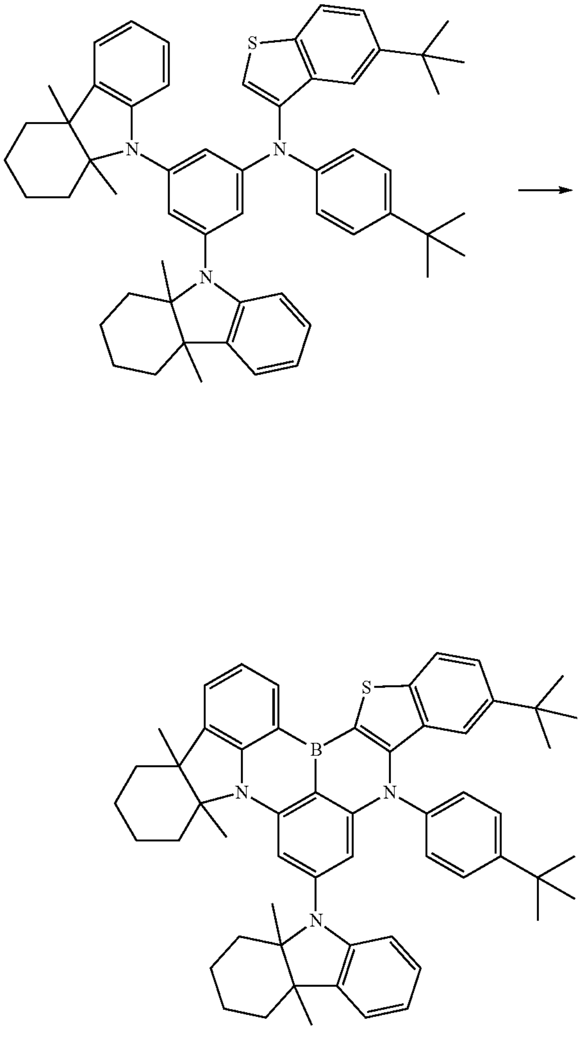

Compound 16

45.8 g (56.4 mmol) of Intermediate 4-c and 460 mL of toluene were placed in a 1 L reactor and 42.4 g (169 mmol) of boron tribromide was added dropwise thereto at −78° C. The mixture was allowed to slowly warm to room temperature. The mixture was stirred at 60° C. for 5 h. After completion of the reaction, water was poured into the reaction mixture at room temperature. The resulting mixture was extracted with ethyl acetate. The organic layer was concentrated and separated by column chromatography to give 3.2 g of (yield 7%) of Compound 16.

MS (MALDI-TOF): m/z 819.48 [$M^+$]

Synthesis Example 5. Synthesis of Compound 49

Compound 49 was synthesized by Reaction 17.

[Reaction 17]

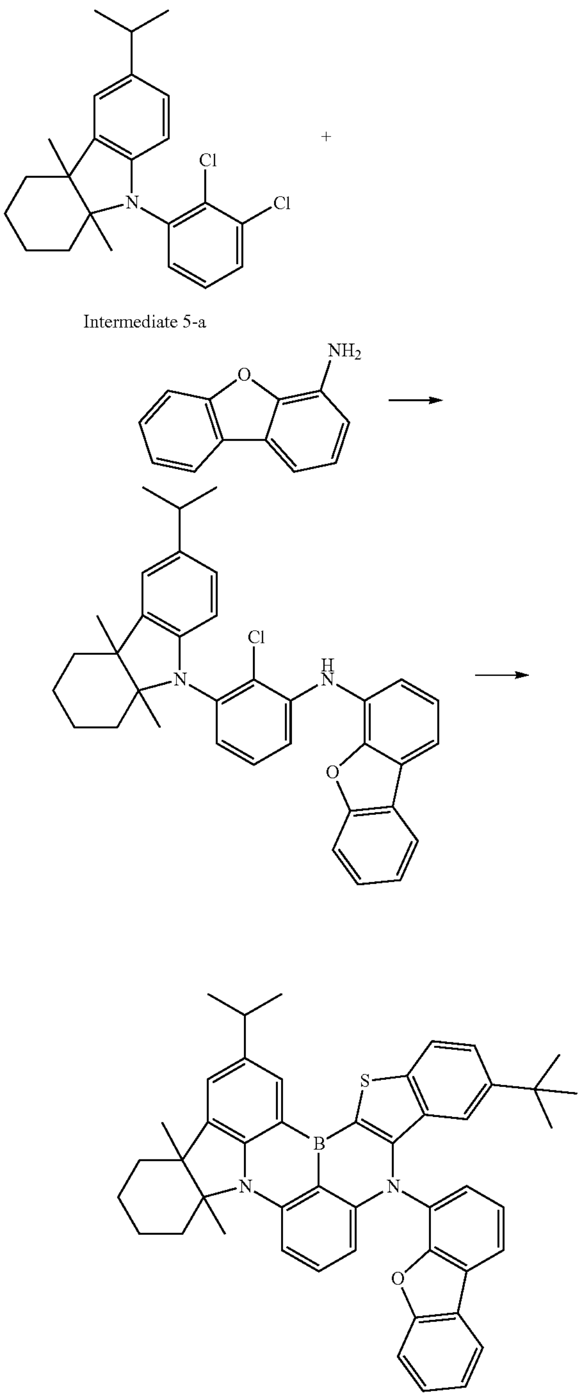

Intermediate 5-a

Compound 49

4 g (yield 15%) of Compound 49 was synthesized in the same manner as in Synthesis Example 2-2, except that Intermediate 5-a was used instead of 4-tert-butylaniline.

MS (MALDI-TOF): m/z 696.33 [$M^+$]

Synthesis Example 6. Synthesis of Compound 59

Compound 59 was synthesized by Reaction 18.

[Reaction 18]

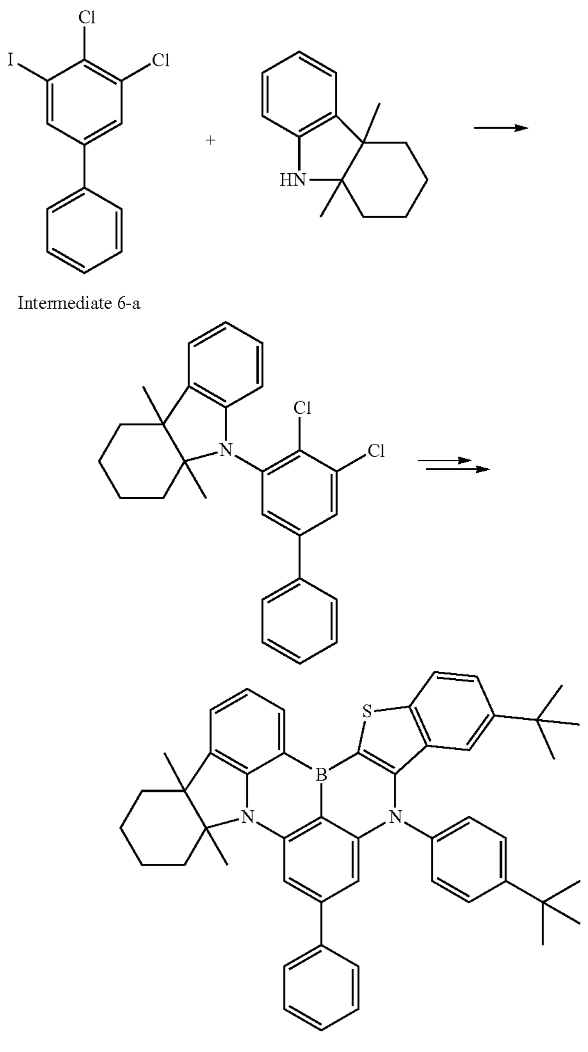

Intermediate 6-a

Compound 59

5.7 g (yield 13%) of Compound 59 was synthesized in the same manner as in Synthesis Example 1-1, except that Intermediate 6-a was used instead of 1,2-dichloro-3-iodo-5-methylbenzene.

MS (MALDI-TOF): m/z 696.37 [$M^+$]

Examples 1-6: Fabrication of Organic Electroluminescent Devices

ITO glass was patterned to have a light emitting area of 2 mm×2 mm, followed by cleaning. After the cleaned ITO glass was mounted in a vacuum chamber, the base pressure was adjusted to $1\times10^{-7}$ torr. HATCN (700 Å) and the compound represented by Formula F (250 Å) were deposited in this order on the ITO. A mixture of the compound represented by BH2 as a host and the inventive compound (3 wt %) shown in Table 1 was used to form a 250 Å thick light emitting layer. Thereafter, a mixture of the compound represented by Formula E-1 and the compound represented by Formula E-2 in a ratio of 1:1 was used to form a 300 Å thick electron transport layer on the light emitting layer. The compound represented by Formula E-1 was used to form a 5 Å thick electron injecting layer on the electron transport layer. Al was used to form a 1000 Å thick Al electrode on the electron injecting layer, completing the fabrication of an organic electroluminescent device. The luminescent properties of the organic electroluminescent device were measured at 0.4 mA.

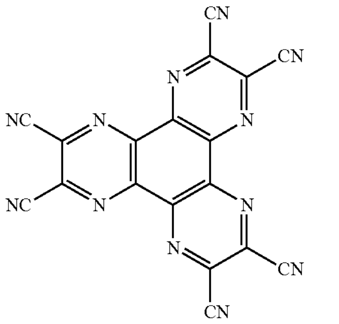

[HATCN]

[Formula F]

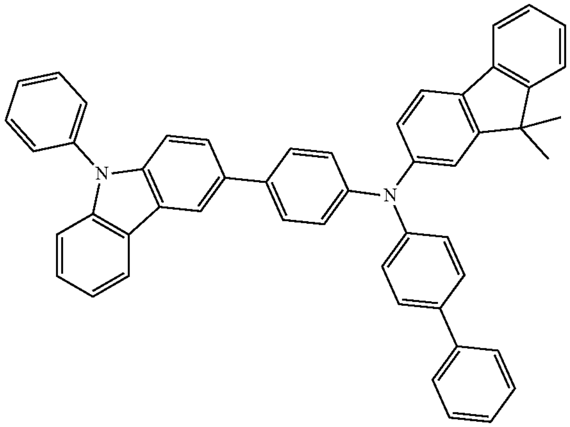

[Formula E-1]

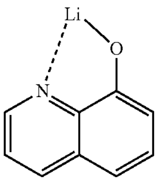

-continued

Formula [E-2]

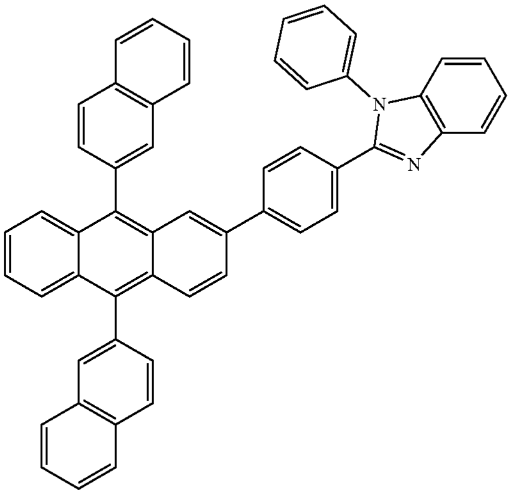

[BH2]

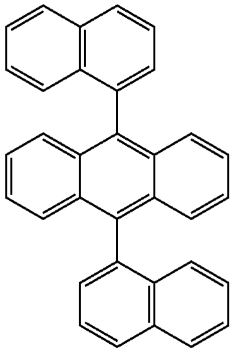

Comparative Examples 1-2

Organic electroluminescent devices were fabricated in the same manner as in Examples 1-6, except that BD1 or BD2 was used instead of the inventive compound. The luminescent properties of the organic electroluminescent devices were measured at 0.4 mA. The structures of BD1 and BD2 are as follow:

[BD1]

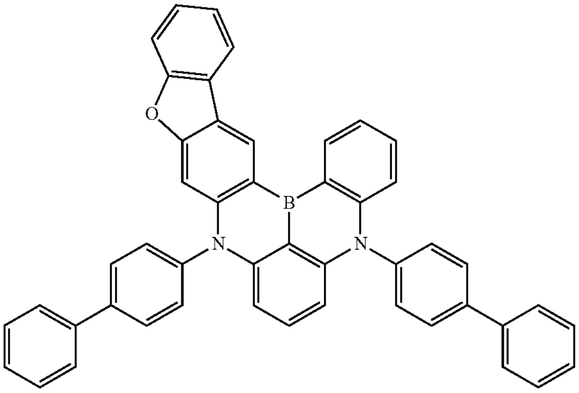

-continued

[BD2]

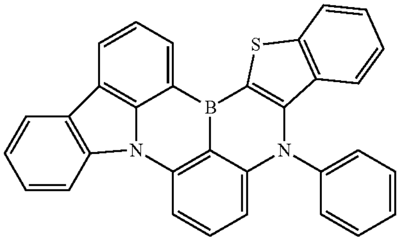

The organic electroluminescent devices of Examples 1-6 and Comparative Examples 1-2 were measured for driving voltage, efficiency, and lifetime. The results are shown in Table 1.

TABLE 1

| Example No. | Dopant | Driving voltage | Efficiency (cd/A) | T97 (hr) |
|---|---|---|---|---|
| Example 1 | Compound 2 | 3.8 | 7.57 | 210 |
| Example 2 | Compound 6 | 3.8 | 7.50 | 187 |
| Example 3 | Compound 15 | 3.8 | 7.83 | 185 |
| Example 4 | Compound 16 | 3.8 | 7.97 | 193 |
| Example 5 | Compound 49 | 3.8 | 8.13 | 206 |
| Example 6 | Compound 59 | 3.8 | 7.68 | 215 |
| Comparative Example 1 | BD1 | 3.8 | 5.42 | 48 |
| Comparative Example 2 | BD2 | 3.8 | 7.22 | 65 |

As can be seen from the results in Table 1, the organic electroluminescent devices of Examples 1-6, each of which employed the inventive compound to form the light emitting layer, had high efficiencies and significantly improved life characteristics compared to the devices of Comparative Examples 1-2, each of which employed the conventional compound due to the structural features of the inventive compounds.

INDUSTRIAL APPLICABILITY

The polycyclic aromatic derivative of the present invention can be employed in an organic layer of an organic electroluminescent device to achieve significantly improved luminous efficiency and long lifetime of the device. Therefore, the polycyclic aromatic derivative of the present invention can find useful industrial applications in various displays and lighting systems.

The invention claimed is:

1. A compound represented by Formula A-1 or A-2:

[Formula A-1]

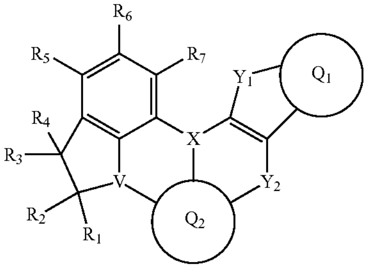

-continued

[Formula A-2]

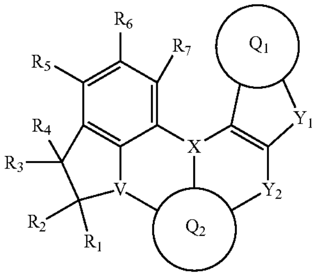

wherein $Q_1$ and $Q_2$ are identical to or different from each other and are each independently a substituted or unsubstituted $C_6$-$C_{50}$ aromatic hydrocarbon ring, a substituted or unsubstituted $C_2$-$C_{50}$ aromatic heterocyclic ring or a substituted or unsubstituted $C_3$-$C_{30}$ mixed aliphatic-aromatic ring, X is selected from B, P, P═O, and P═S, $Y_1$ and $Y_2$ are identical to or different from each other and are each independently selected from N-$R_8$, $CR_9R_{10}$, O, S, Se, and $SiR_{11}R_{12}$, V is selected from N and P, and $R_1$ to $R_{12}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that $R_2$ and $R_3$ are optionally linked to each other to form a monocyclic or polycyclic ring, $R_7$ is optionally bonded to the adjacent ring $Q_1$ to form an alicyclic or aromatic monocyclic or polycyclic ring, each of $R_8$ to $R_{12}$ is optionally bonded to one or more of the rings $Q_1$ and $Q_2$ to form an alicyclic or aromatic monocyclic or polycyclic ring, $R_5$ and $R_6$ are optionally linked to each other to form an alicyclic or aromatic monocyclic or polycyclic ring, $R_9$ and $R_{10}$ are optionally linked to each other to form an alicyclic or aromatic monocyclic or polycyclic ring, and $R_{11}$ and $R_{12}$ are optionally linked to each other to form an alicyclic or aromatic monocyclic or polycyclic ring.

2. The compound according to claim 1, wherein the compound of Formula A-1 is represented by Formula A-3:

[Formula A-3]

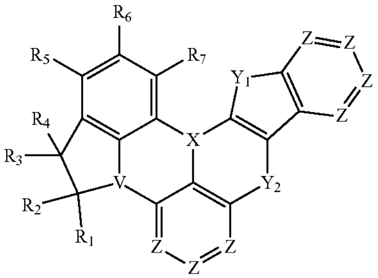

wherein the moieties Z are identical to or different from each other and are each independently CR or N, the groups R are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_3$-$C_{30}$ cycloalkyl, substituted or unsubstituted $C_2$-$C_{50}$ heteroaryl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_5$-$C_{30}$ arylthioxy, substituted or unsubstituted $C_1$-$C_{30}$ alkylamine, substituted or unsubstituted $C_5$-$C_{30}$ arylamine, substituted or unsubstituted $C_1$-$C_{30}$ alkylsilyl, substituted or unsubstituted $C_5$-$C_{30}$ arylsilyl, nitro, cyano, and halogen, with the proviso that the groups R are optionally bonded to each other or are each independently optionally linked to an adjacent substituent to form an alicyclic or aromatic monocyclic or polycyclic ring and one or more of the carbon atoms in the alicyclic or aromatic monocyclic or polycyclic ring are optionally replaced with heteroatoms selected from N, S, and O, and X, $Y_1$, $Y_2$, V, and $R_1$ to $R_7$ are as defined in Formulae A-1 and A-2, and the compound of Formula A-2 is represented by Formula A-4:

[Formula A-4]

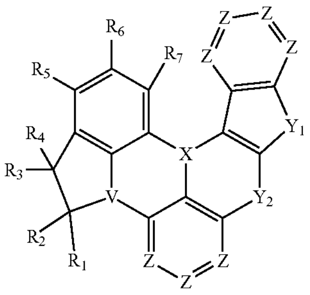

wherein Z and R are as defined in Formula A-3 and X, $Y_1$, $Y_2$, V, and $R_1$ to $R_7$ are as defined in Formulae A-1 and A-2.

3. The compound according to claim 1, wherein the compound represented by Formula A-1 or A-2 is selected from the following compounds 1 to 63:

1

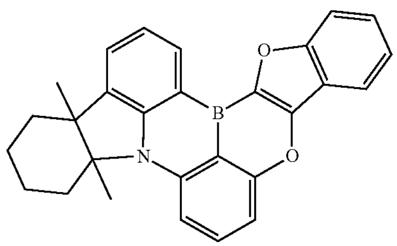

-continued

2

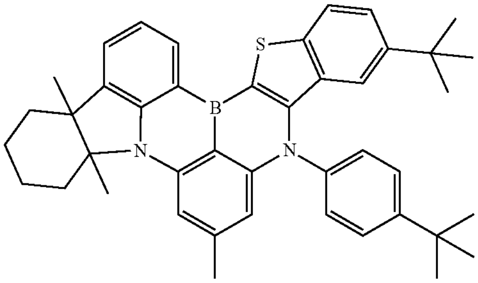

3

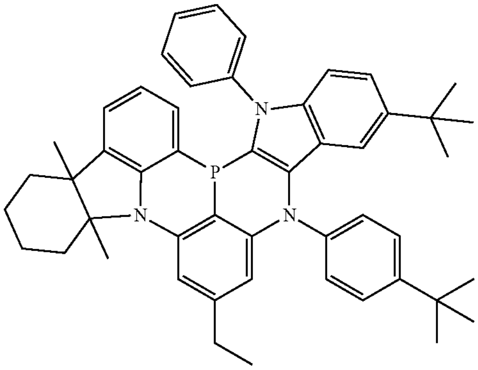

4

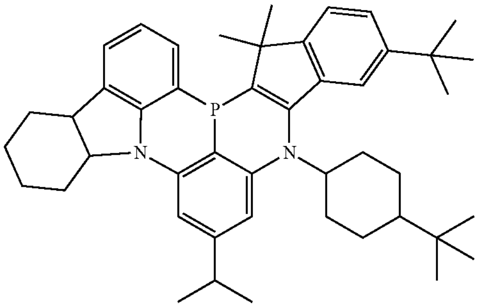

5

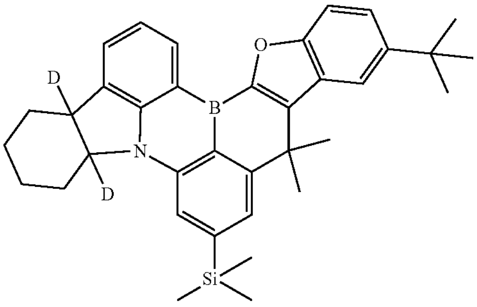

6

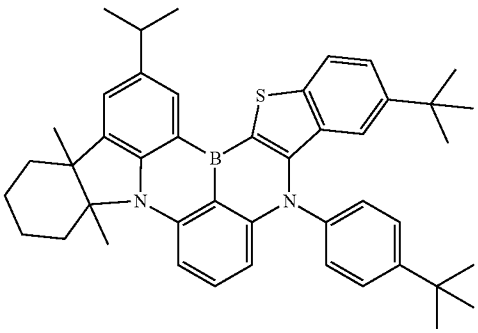

-continued
7
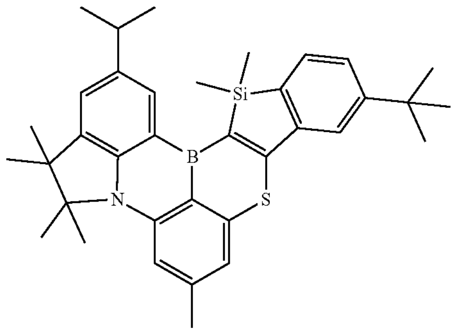
8
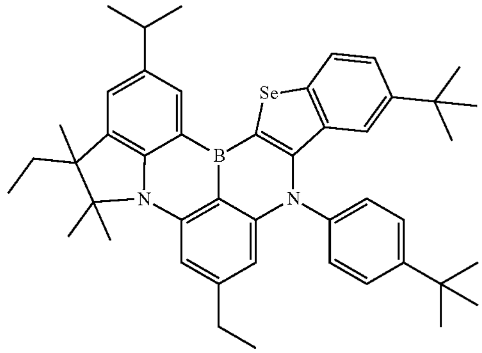
9
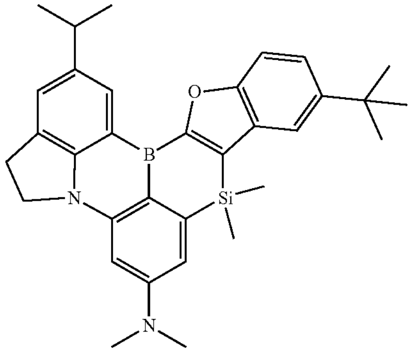
10
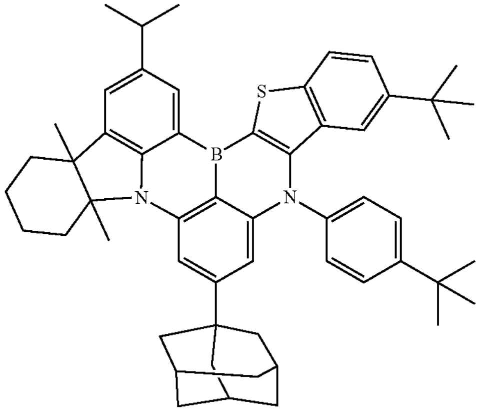
-continued
11
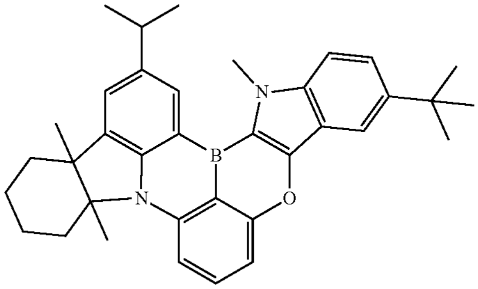
12
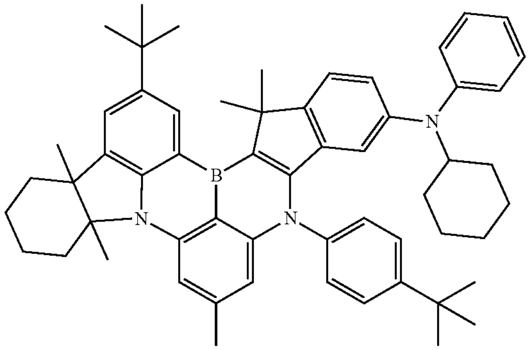
13
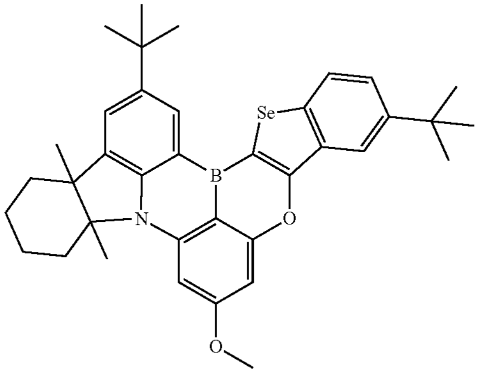
14
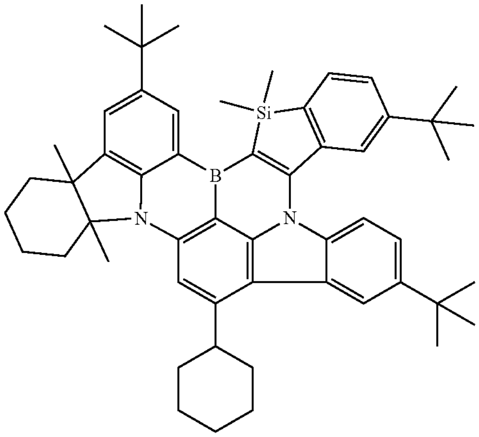

-continued
15
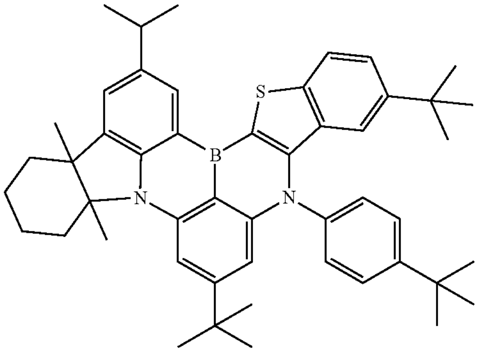
16
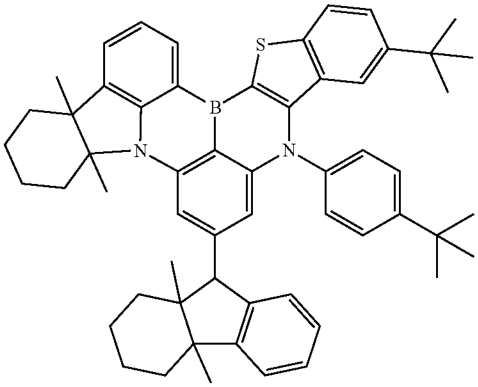
17
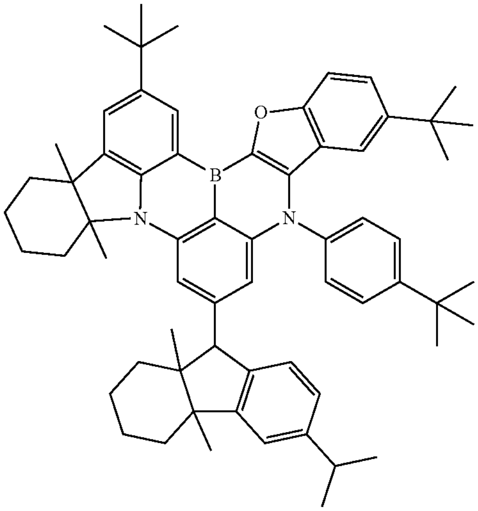
-continued
18
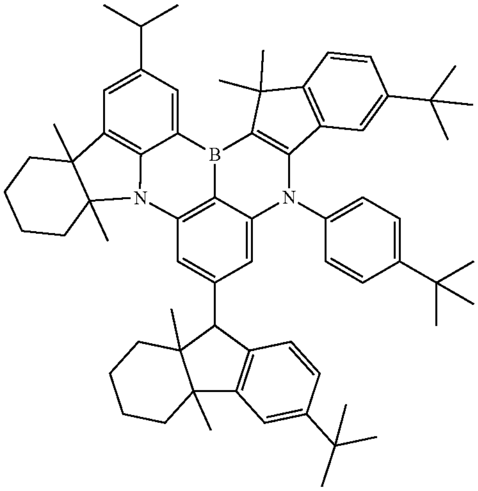
19
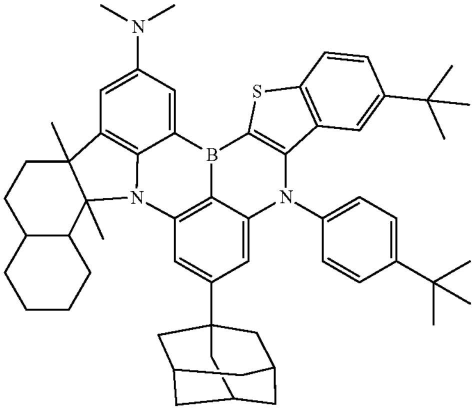
20
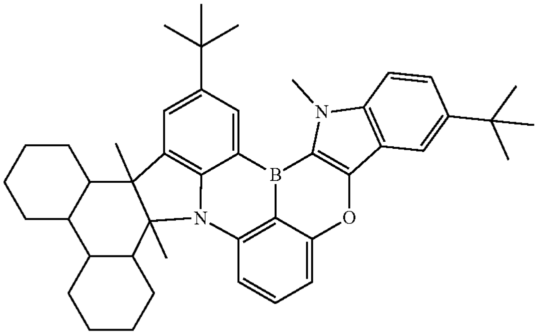

21
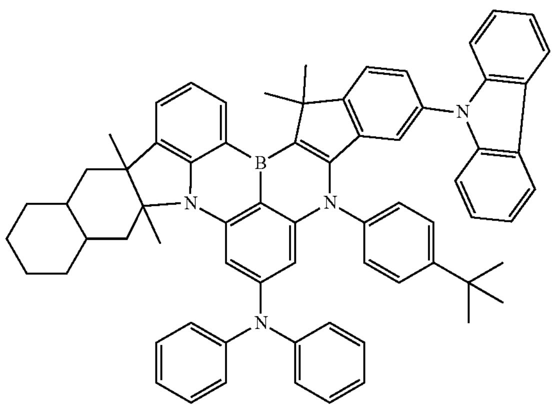
22
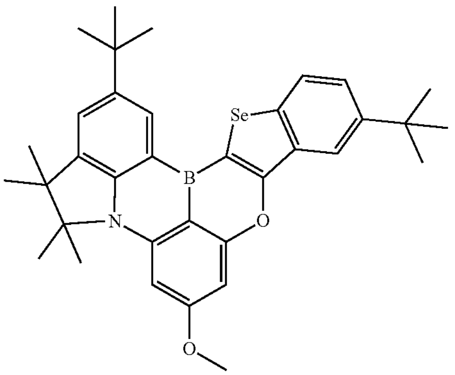
23
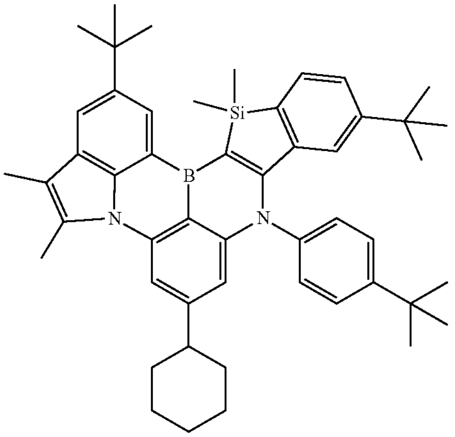
24
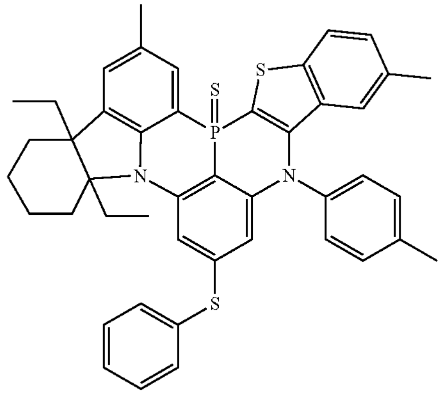
25
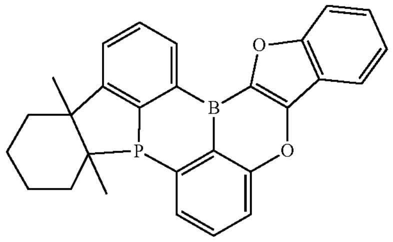
26
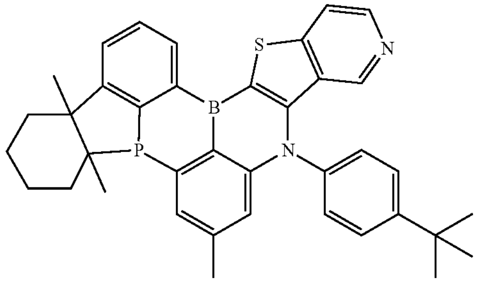
27
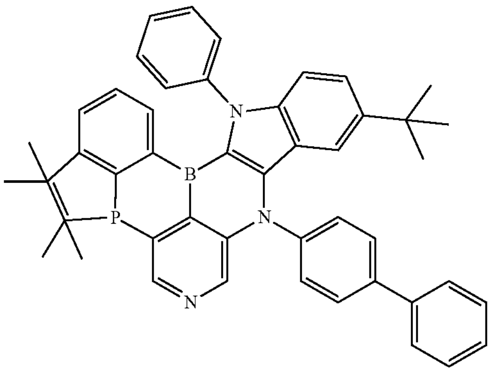
28
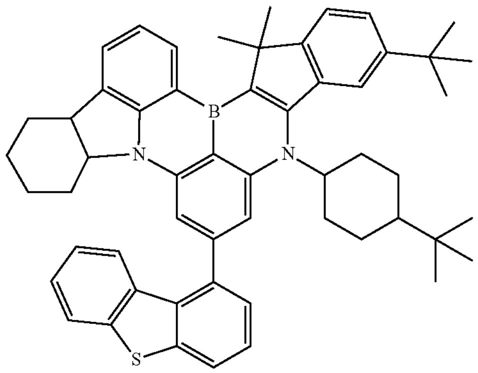

-continued
29
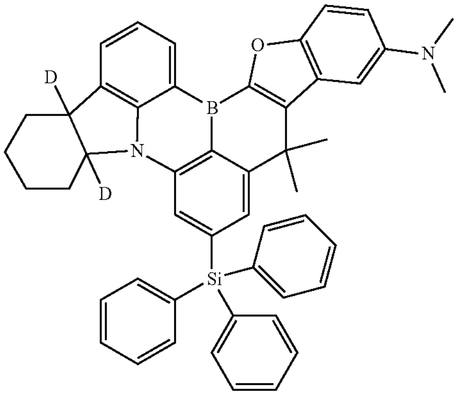
30
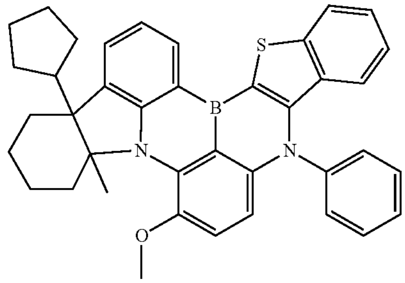
31
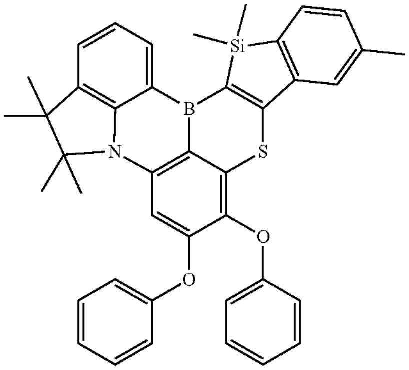
32
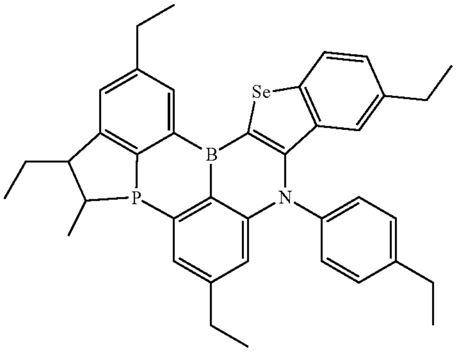
-continued
33
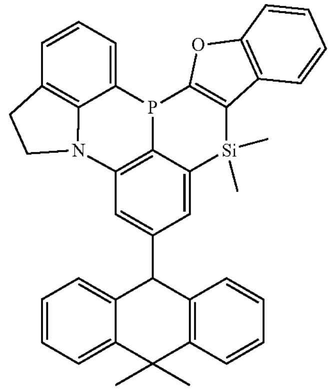
34
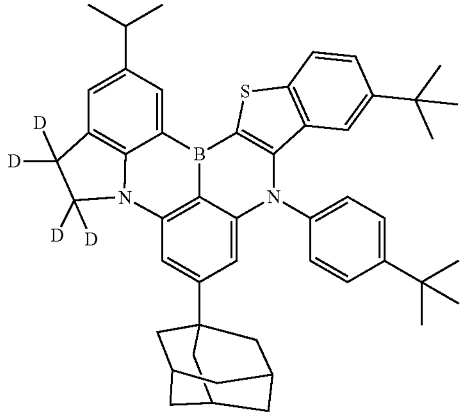
35
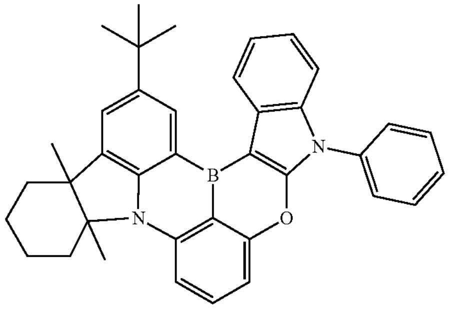
36
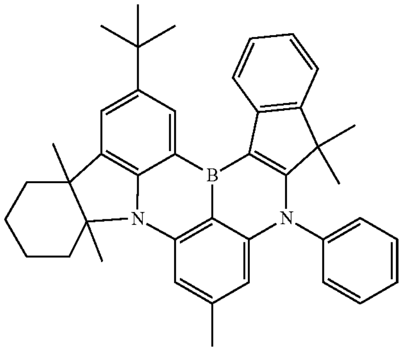

-continued
37
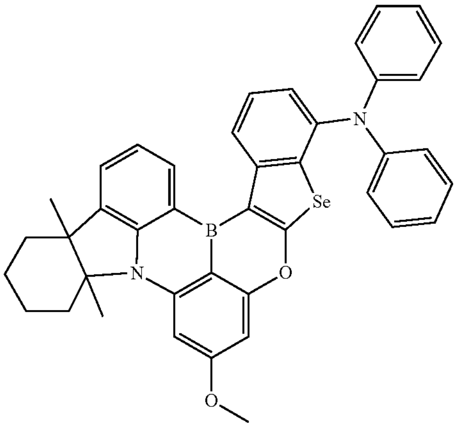
38
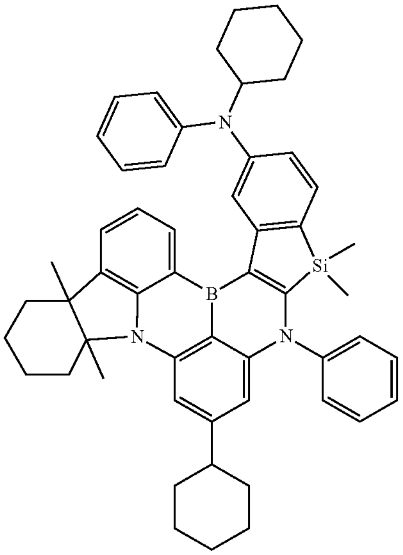
39
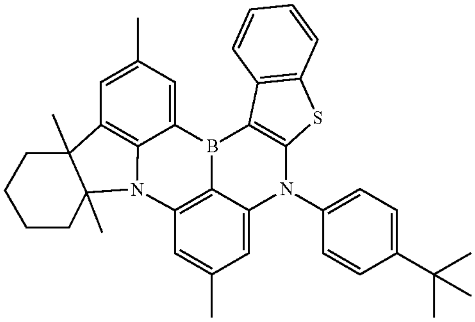
-continued
40
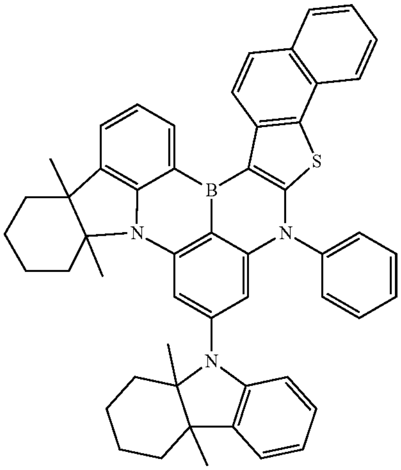
41
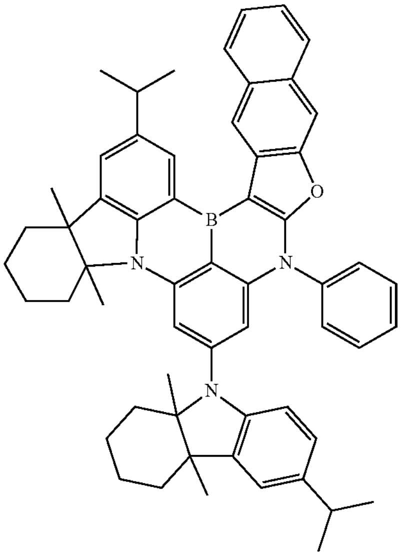
42
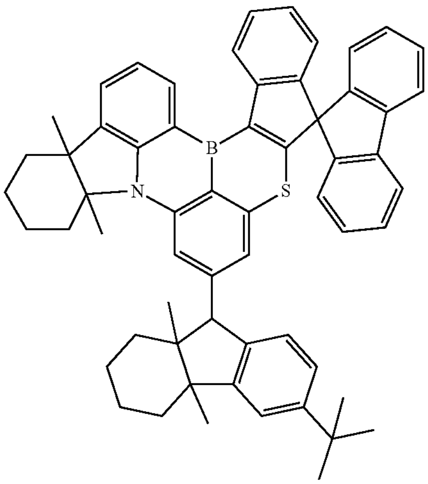

-continued
43
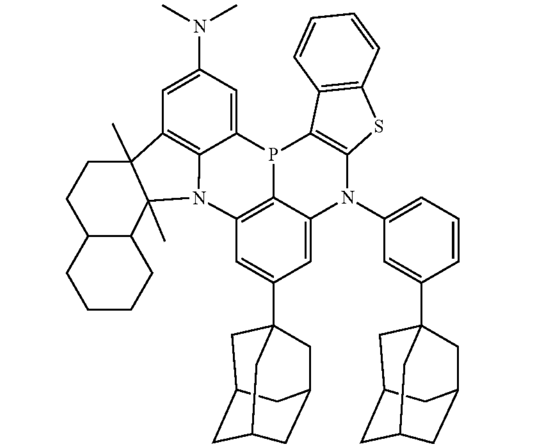
44
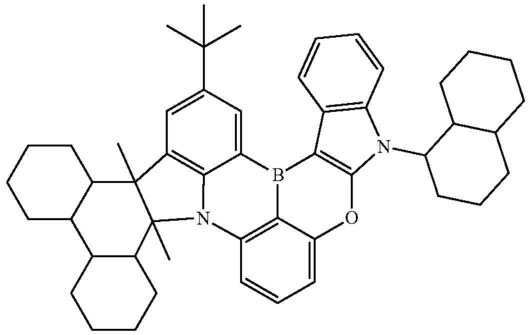
45
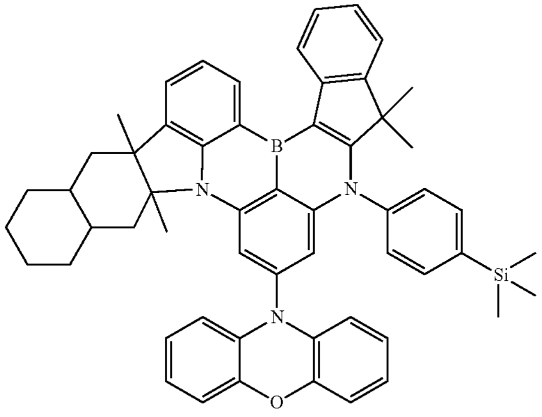
46
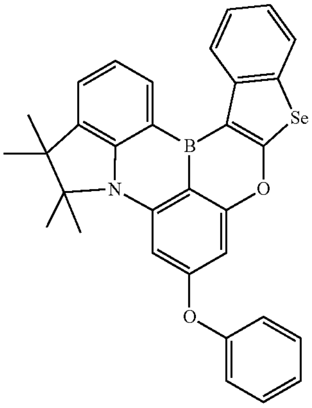
-continued
47
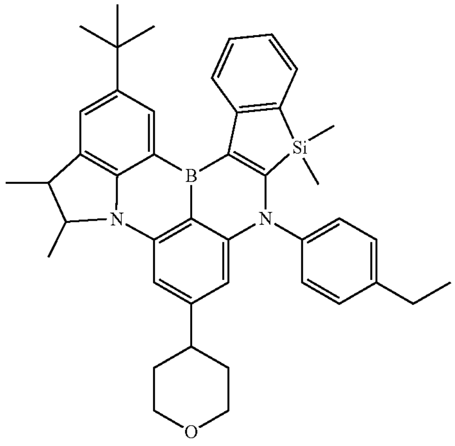
48
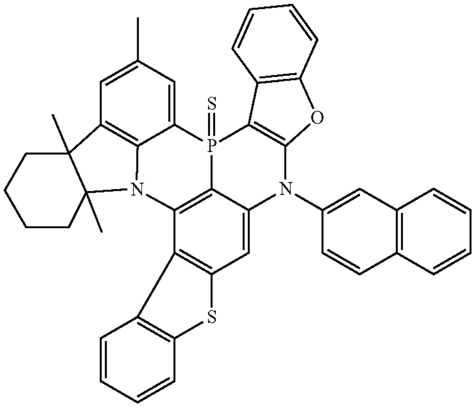
49
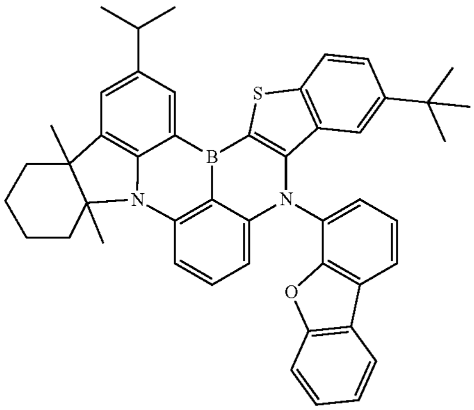

-continued
50
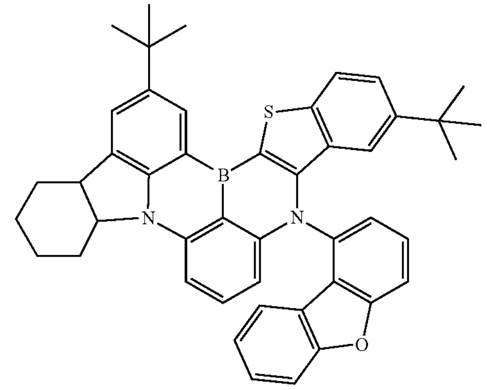
51
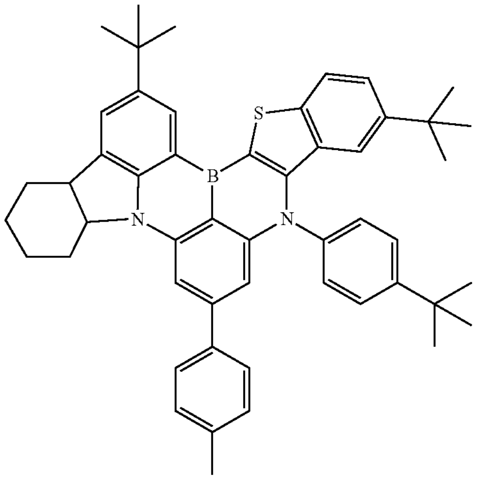
52
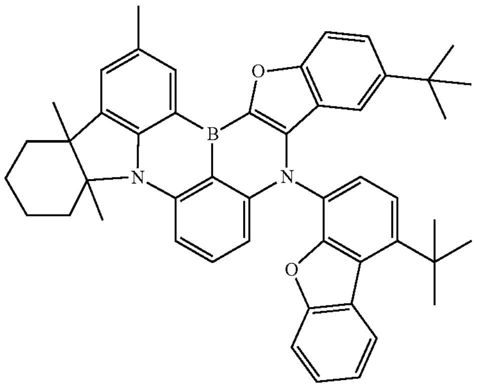
-continued
53
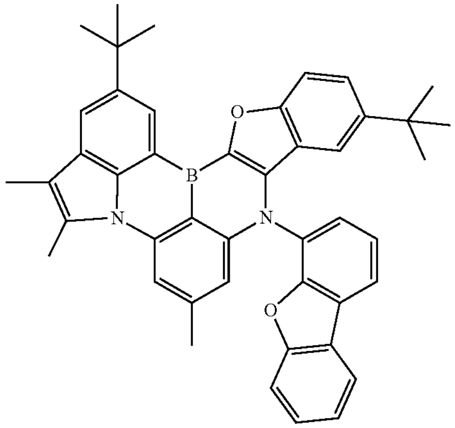
54
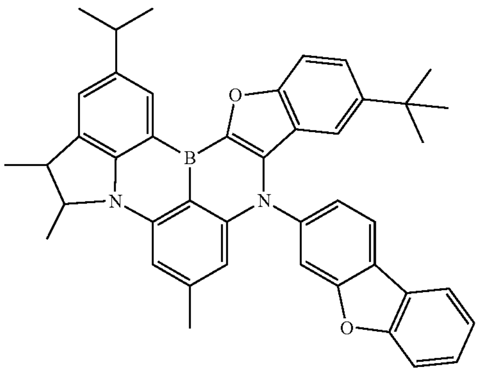
55
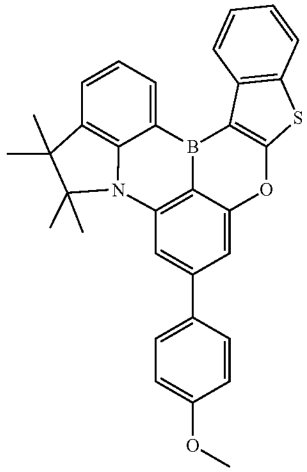

-continued
56
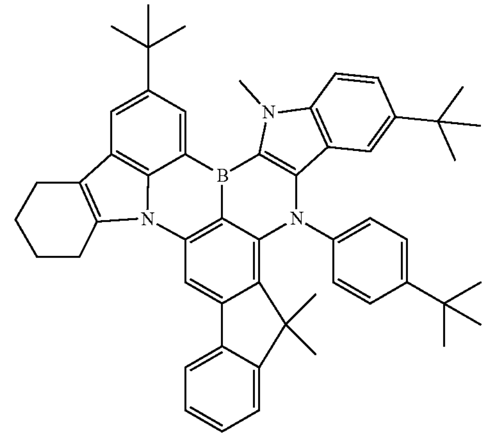
57
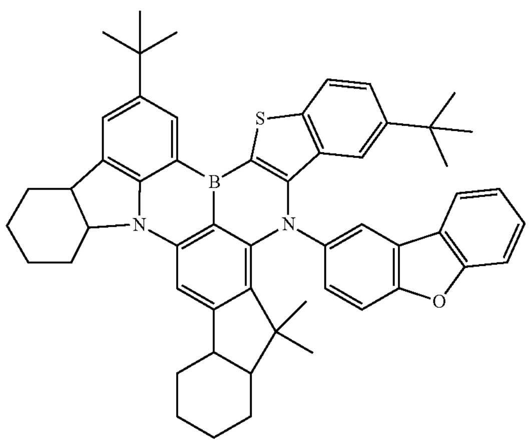
58
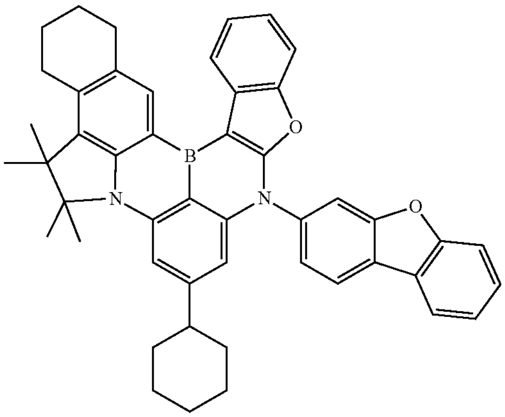
-continued
59
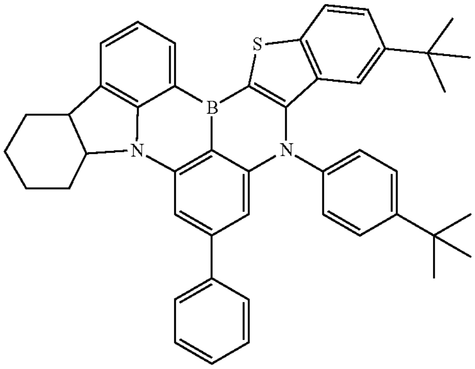
60
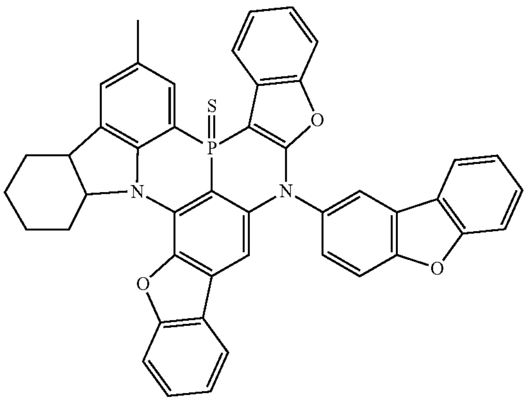
61
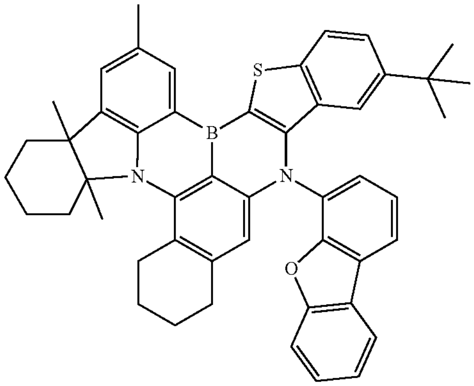
62
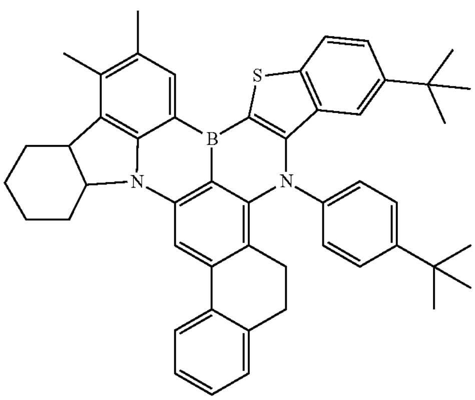

-continued

63

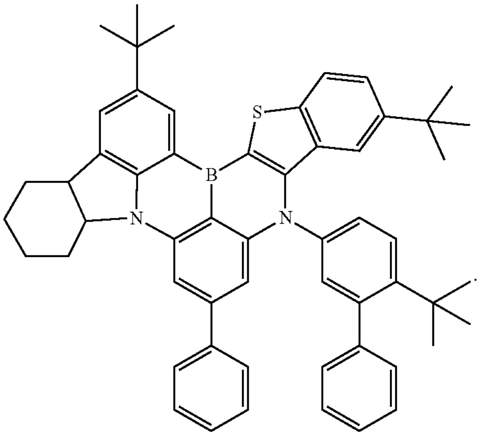

4. An organic electroluminescent device comprising a first electrode, a second electrode, and one or more organic layers interposed between the first and second electrodes wherein one of the organic layers comprises the compound represented by Formula A-1 or A-2 according to claim 1.

5. The organic electroluminescent device according to claim 4, wherein the organic layers comprise an electron injecting layer, an electron transport layer, a hole injecting layer, a hole transport layer, an electron blocking layer, a hole blocking layer, and/or a light emitting layer, at least one of which comprises the compound represented by Formula A-1 or A-2.

6. The organic electroluminescent device according to claim 5, wherein the light emitting layer comprises, as a host compound, an anthracene derivative represented by Formula C:

[Formula C]

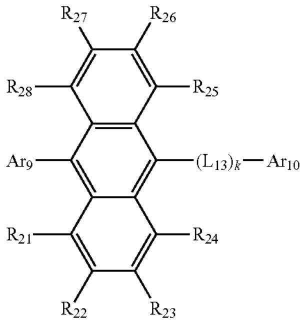

wherein $R_{21}$ to $R_{28}$ are identical to or different from each other and are as defined for $R_1$ to $R_{12}$ in Formula A-1 or A-2 according to claim 1, $Ar_9$ and $Ar_{10}$ are identical to or different from each other and are each independently selected from hydrogen, deuterium, substituted or unsubstituted $C_1$-$C_{30}$ alkyl, substituted or unsubstituted $C_6$-$C_{50}$ aryl, substituted or unsubstituted $C_2$-$C_{30}$ alkenyl, substituted or unsubstituted $C_2$-$C_{20}$ alkynyl, substituted or unsubstituted $C_3$-$C_{30}$ cycloalkyl, substituted or unsubstituted $C_5$-$C_{30}$ cycloalkenyl, substituted or unsubstituted $C_2$-$C_{50}$ heteroaryl, substituted or unsubstituted $C_2$-$C_{30}$ heterocycloalkyl, substituted or unsubstituted $C_1$-$C_{30}$ alkoxy, substituted or unsubstituted $C_6$-$C_{30}$ aryloxy, substituted or unsubstituted $C_1$-$C_{30}$ alkylthioxy, substituted or unsubstituted $C_6$-$C_{30}$ arylthioxy, substituted or unsubstituted $C_1$-$C_{30}$ alkylamine, substituted or unsubstituted $C_6$-$C_{30}$ arylamine, substituted or unsubstituted $C_1$-$C_{30}$ alkylsilyl, and substituted or unsubstituted $C_6$-$C_{30}$ arylsilyl, $L_{13}$ is a single bond or is selected from substituted or unsubstituted $C_6$-$C_{20}$ arylene and substituted or unsubstituted $C_2$-$C_{20}$ heteroarylene, and k is an integer from $_1$ to $_3$, provided that when k is $_2$ or more, the linkers $L_{13}$ are identical to or different from each other.

7. The organic electroluminescent device according to claim 6, wherein $Ar_9$ in Formula C is represented by Formula C-1:

[Fromula C-1]

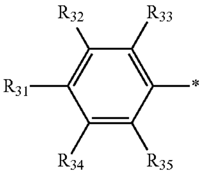

wherein $R_{31}$ to $R_{35}$ are identical to or different from each other and are as defined for $R_1$ to $R_{12}$ in Formula A-1 or A-2 according to claim 1 and each of $R_{31}$ to $R_{35}$ is optionally bonded to an adjacent substituent to form a saturated or unsaturated ring.

8. The organic electroluminescent device according to claim 6, wherein the anthracene derivative of Formula C is selected from the compounds represented by Formulae C1 to C48:

C1

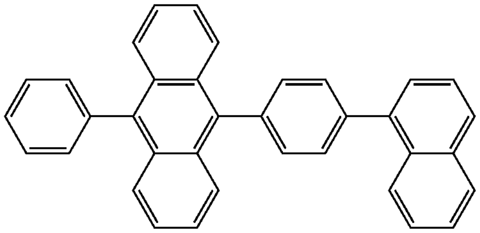

C2

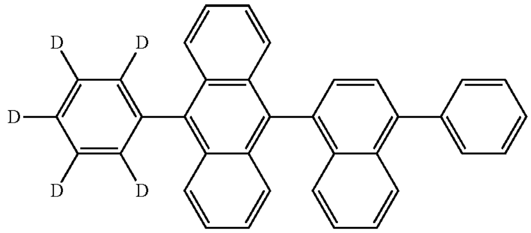

C3

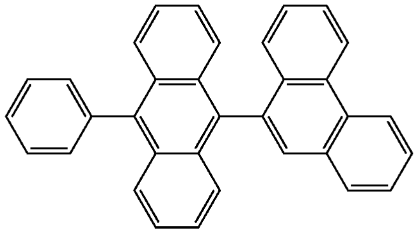

-continued
C4
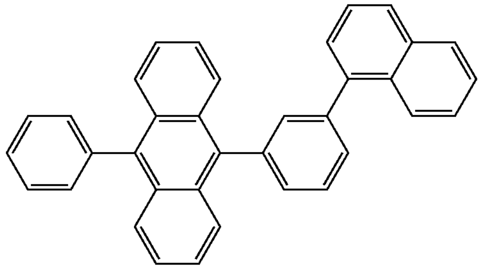
C5
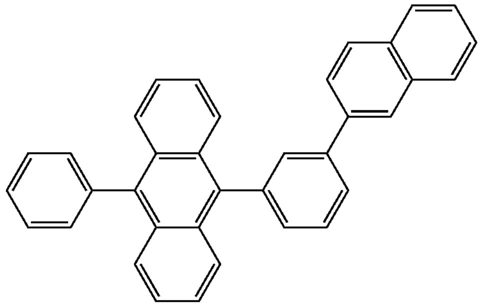
C6
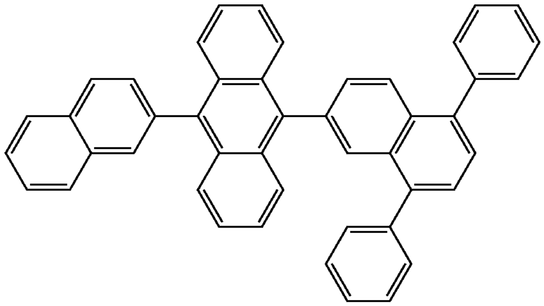
C7
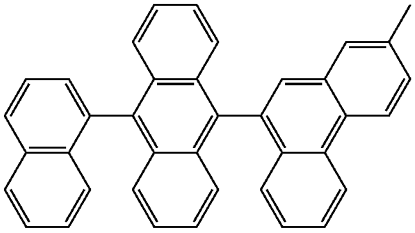
C8
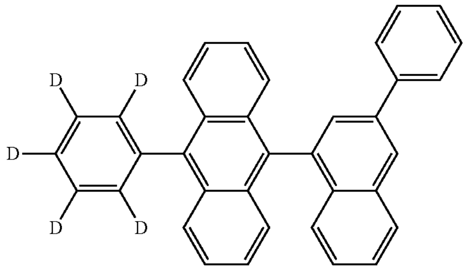
-continued
C9
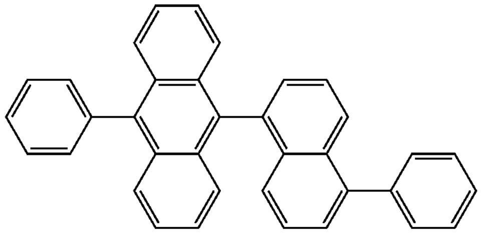
C10
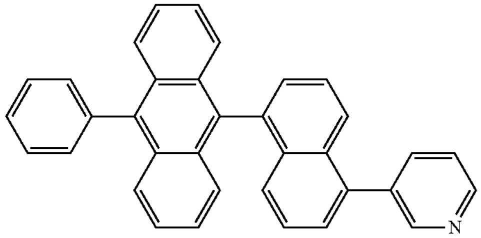
C11
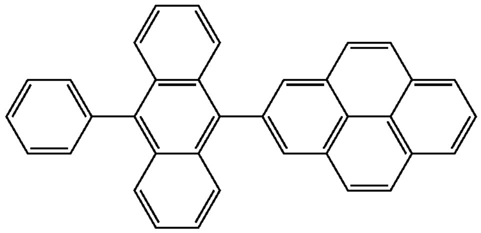
C12
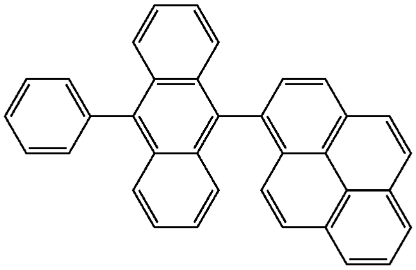
C13
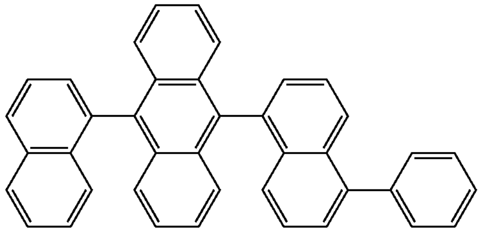
C14
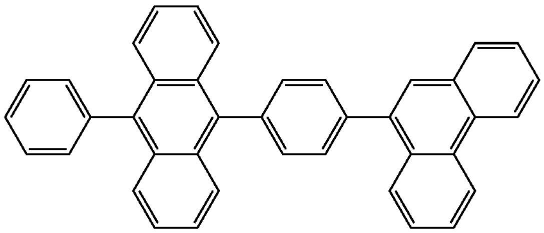

-continued
C15
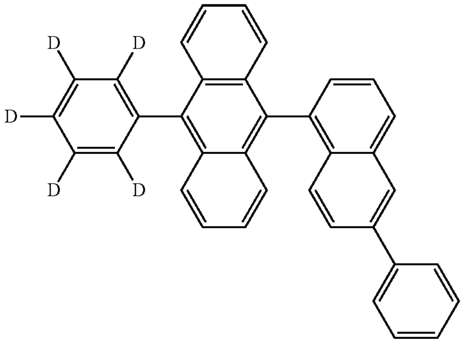
C16
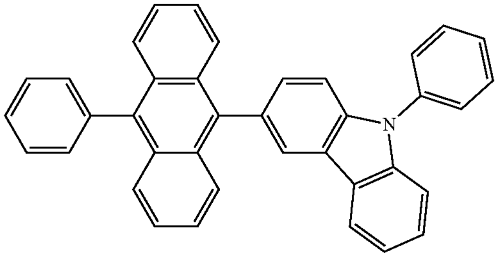
C17
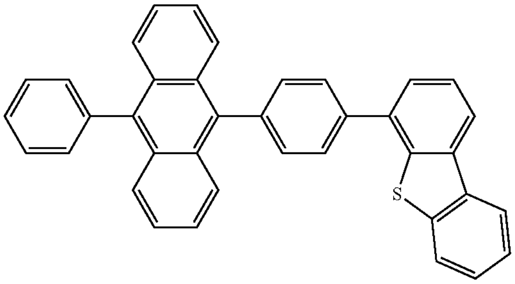
C18
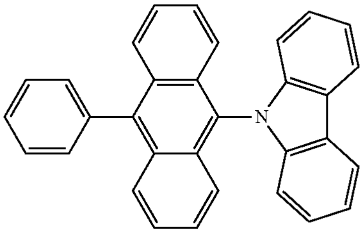
C19
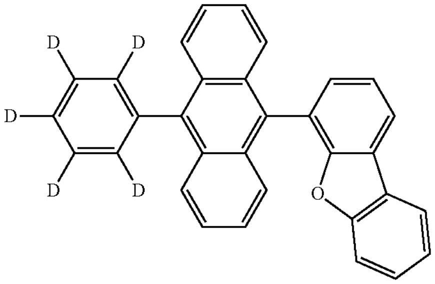
-continued
C20
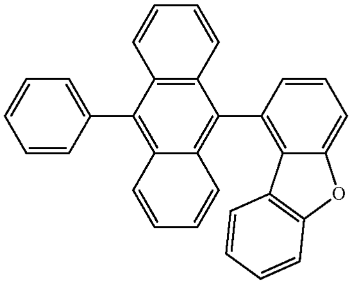
C21
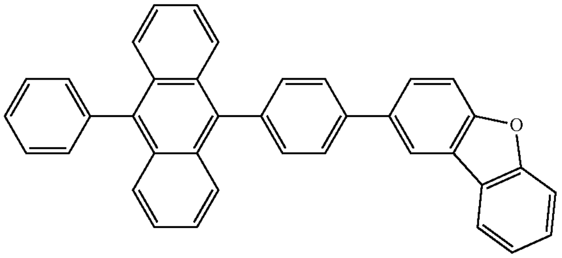
C22
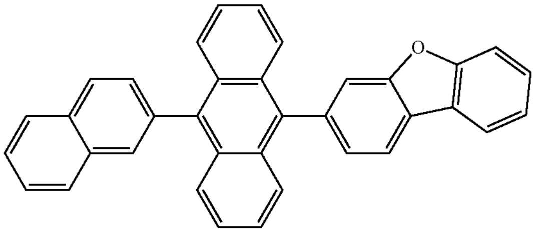
C23
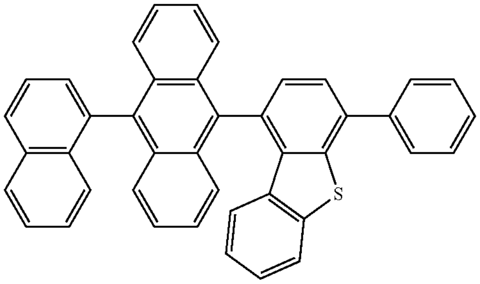
C24
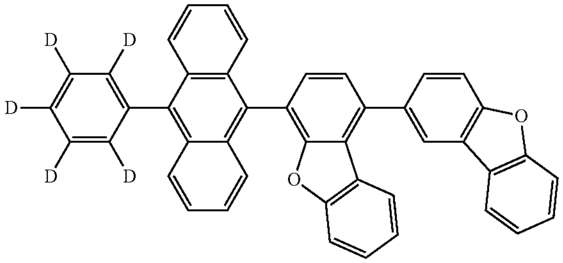

-continued
C25
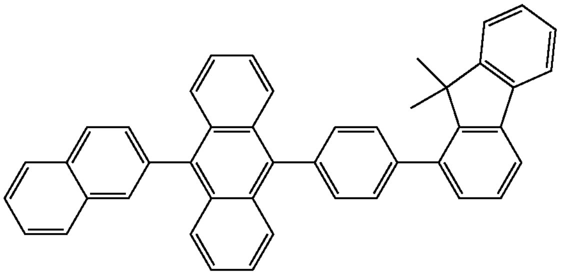
C26
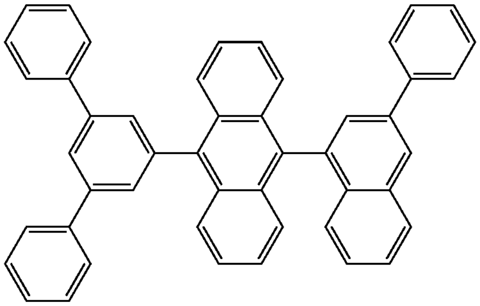
C27
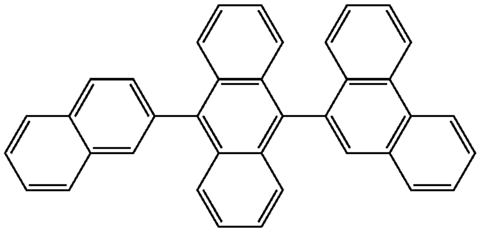
C28
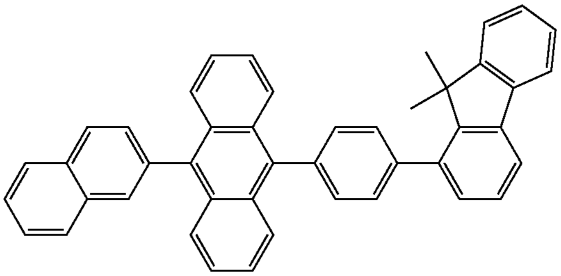
C29
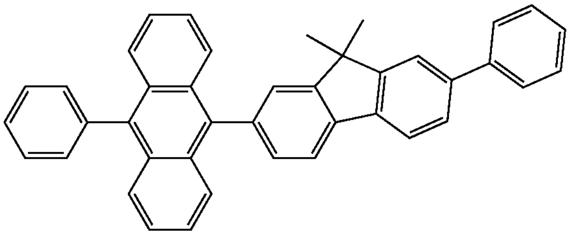
-continued
C30
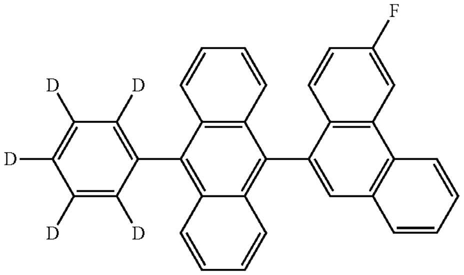
C31
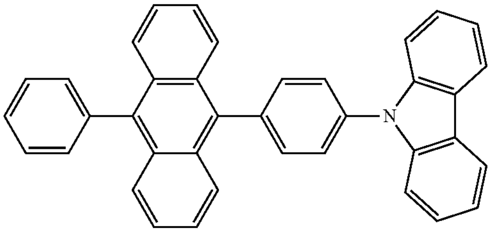
C32
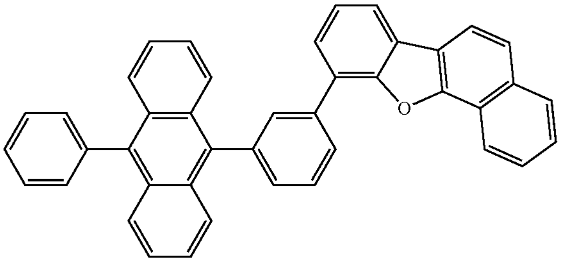
C33
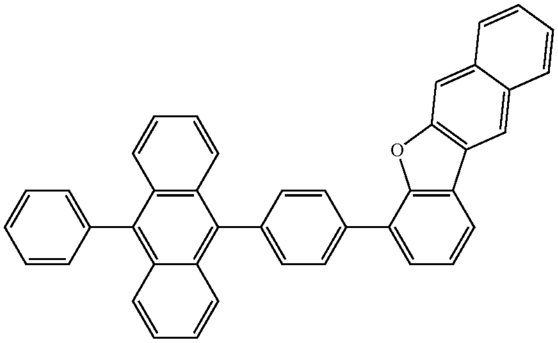
C34
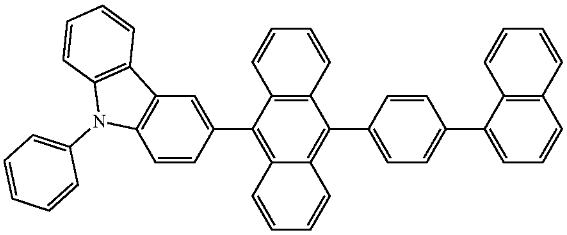

-continued
C35
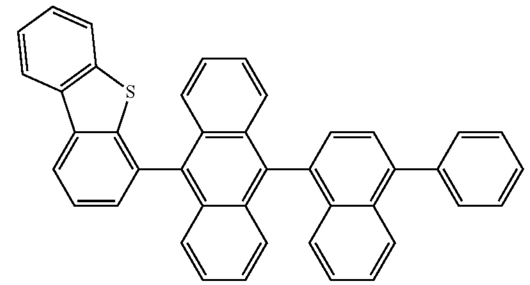
C36
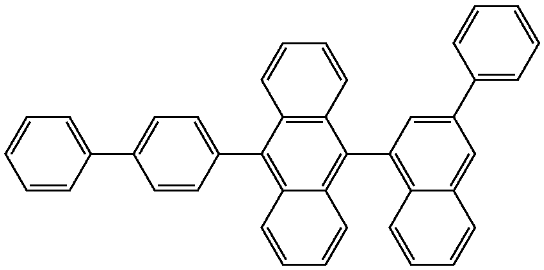
C37
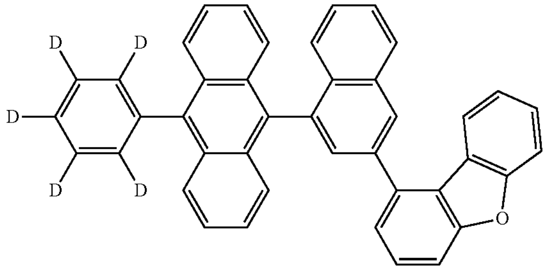
C38
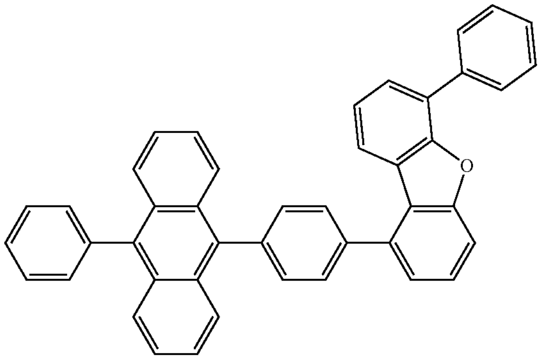
C39
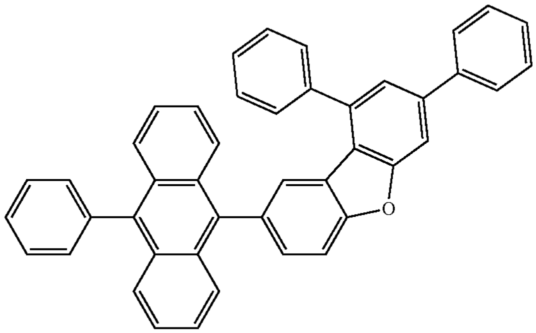
-continued
C40
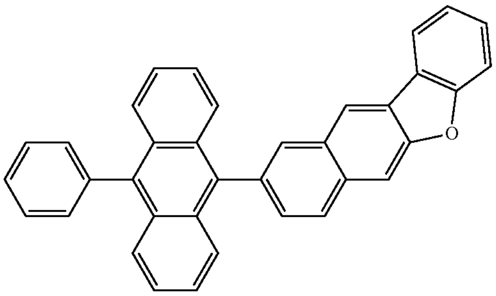
C41
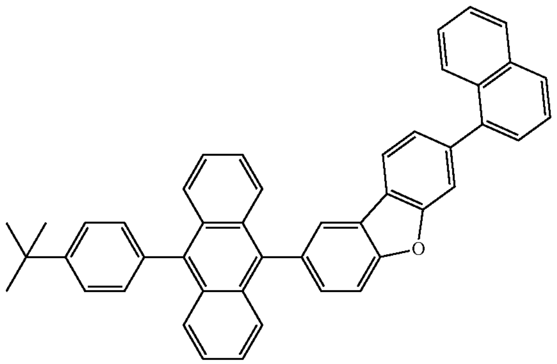
C42
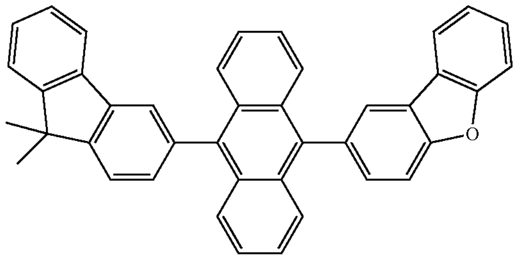
C43
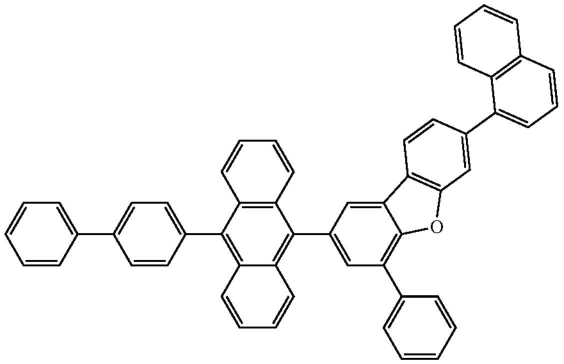

-continued

C44

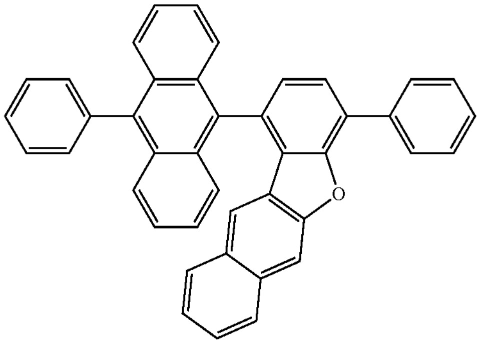

C45

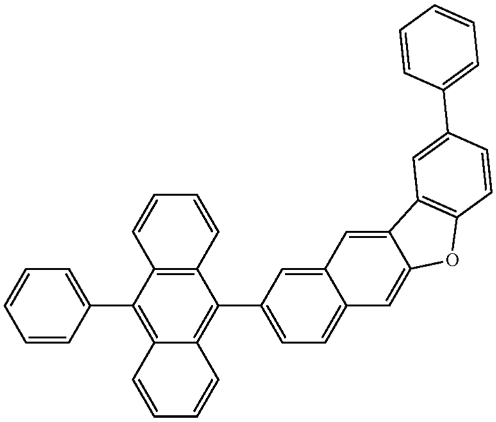

C46

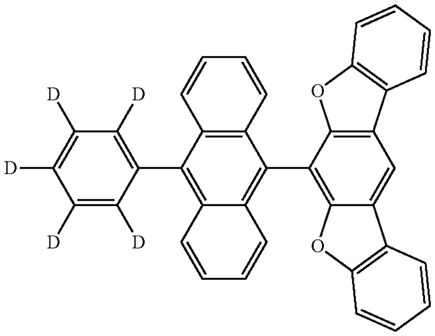

-continued

C47

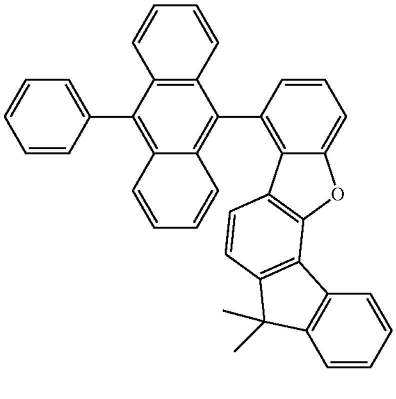

C48

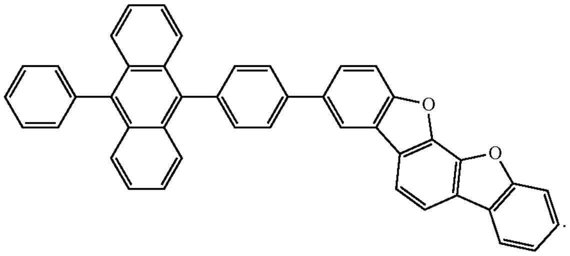

9. The organic electroluminescent device according to claim 5, wherein one or more of the layers are formed by a deposition or solution process.

10. The organic electroluminescent device according to claim 4, wherein the organic electroluminescent device is used in a display or lighting system selected from flat panel displays, flexible displays, monochromatic flat panel lighting systems, white flat panel lighting systems, flexible monochromatic lighting systems, and flexible white lighting systems.

* * * * *